(12) United States Patent
Shimizu et al.

(10) Patent No.: US 11,101,106 B2
(45) Date of Patent: *Aug. 24, 2021

(54) EXPOSURE DEVICE

(71) Applicant: ADVANTEST CORPORATION, Tokyo (JP)

(72) Inventors: Youichi Shimizu, Tochigi (JP); Hitoshi Tanaka, Tochigi (JP)

(73) Assignee: ADVANTEST CORPORATION, Tokyo (JP)

( * ) Notice: Subject to any disclaimer, the term of this patent is extended or adjusted under 35 U.S.C. 154(b) by 49 days.

This patent is subject to a terminal disclaimer.

(21) Appl. No.: 16/499,327

(22) PCT Filed: Apr. 11, 2017

(86) PCT No.: PCT/JP2017/014880
§ 371 (c)(1),
(2) Date: Sep. 30, 2019

(87) PCT Pub. No.: WO2018/189817
PCT Pub. Date: Oct. 18, 2018

(65) Prior Publication Data
US 2021/0104379 A1    Apr. 8, 2021

(51) Int. Cl.
*H01J 37/31*    (2006.01)
*H01J 37/14*    (2006.01)
(Continued)

(52) U.S. Cl.
CPC ........ *H01J 37/3174* (2013.01); *H01J 37/141* (2013.01); *H01J 37/20* (2013.01)

(58) Field of Classification Search
CPC ....... H01J 37/3174; H01J 37/141; H01J 37/20
(Continued)

(56) References Cited

U.S. PATENT DOCUMENTS 10,824,077 B2 *  11/2020  Shimizu ................. H01J 37/18
2006/0169910 A1    8/2006  Frosien
(Continued)

FOREIGN PATENT DOCUMENTS

JP    2002118054 A    4/2002
JP    2002352763 A    12/2002
(Continued)

OTHER PUBLICATIONS

International Search Report and (ISA/237) Written Opinion of the International Search Authority for International Patent Application No. PCT/JP2017/014880, mailed by the Japan Patent Office dated Jul. 18, 2017.

(Continued)

*Primary Examiner* — Nicole M Ippolito

(57) ABSTRACT

A multi-beam exposure device reducing variations of electron beam optical systems for electron beams, and preventing vacuum leakage. An exposure device is provided, including: a body tube depressurized to produce a vacuum state therein; multiple charged particle beam sources provided in the body tube, and emitting multiple charged particle beams in a direction of extension of the body tube; multiple electromagnetic optical elements, each provided corresponding to one of the multiple charged particle beams in the body tube, and controlling the one of the multiple charged particle beams; first and second partition walls arranged separately from each other in the direction of extension in the body tube, and forming a non-vacuum space between at least parts of the first and second partition walls; and a supporting unit provided in the body tube, and supporting the multiple electromagnetic optical elements for positioning of the multiple electromagnetic optical elements.

20 Claims, 13 Drawing Sheets

(51) Int. Cl.
*H01J 37/20* (2006.01)
*H01J 37/317* (2006.01)
*H01J 37/141* (2006.01)

(58) Field of Classification Search
USPC ......... 250/396 R, 397, 492.1, 492.2, 492.21, 250/492.22, 492.23, 492.3
See application file for complete search history.

(56) References Cited

U.S. PATENT DOCUMENTS

| | | |
|---|---|---|
| 2011/0148297 A1 | 6/2011 | Yasuda |
| 2012/0145900 A1 | 6/2012 | Chen |
| 2013/0134322 A1 | 5/2013 | Yasuda |
| 2014/0106268 A1 | 4/2014 | Imaoka |
| 2015/0014530 A1 | 1/2015 | Ominami |
| 2017/0323760 A1 | 11/2017 | Masaki |
| 2017/0330739 A1 | 11/2017 | Takashi |
| 2019/0198293 A1 | 6/2019 | Munehiro |

FOREIGN PATENT DOCUMENTS

| | | |
|---|---|---|
| JP | 2005064097 A | 3/2005 |
| JP | 2006054240 A | 2/2006 |
| JP | 2012151102 A | 8/2012 |
| JP | 2014082327 A | 5/2014 |

OTHER PUBLICATIONS

International Search Report and (ISA/237) Written Opinion of the International Search Authority for International Patent Application No. PCT/JP2017/014879, issued/mailed by the Japan Patent Office dated Jul. 11, 2017.

\* cited by examiner

EXPOSURE DEVICE

CROSS-REFERENCE TO RELATED APPLICATIONS

This application is a National Stage entry of International Patent Application No. PCT/JP2017/014880 filed on Apr. 11, 2017, the contents of which are hereby incorporated by reference in its entirety.

BACKGROUND

1. Technical Field

The present invention relates to an exposure device.

2. Related Art

There are known conventional exposure techniques to draw circuit patterns on a semiconductor wafer by using electron beam exposure devices. In addition, there are also known multi-beam exposure techniques to improve throughput by generating a plurality of electron beams, and drawing circuit patterns on a semiconductor wafer by using each beam (see Patent Documents 1 to 3, for example).
Patent Document 1: Japanese Patent Application Publication No. 2012-151102
Patent Document 2: WO2012/057166
Patent Document 3: Japanese Patent Application Publication No. 2013-175377

An electron beam exposure device includes a plurality of areas of electronic circuits which operate in an atmospheric pressure environment, and a plurality of vacuum areas where electron beams are generated, accelerated and concentrated. A multi-beam exposure device has a complicated configuration since a plurality of atmospheric pressure areas and a plurality of vacuum areas are arranged close to each other. Accordingly, even if the multi-beam exposure device is assembled highly precisely at atmospheric pressure, in some cases, formation of the vacuum areas by vacuum exhaustion inadvertently causes deformation of partition walls separating the atmospheric pressure areas from the vacuum areas, and inadvertently changes some or all of the optical systems of a plurality of electron beams separately and independently in a complicated manner. In addition, such deformation of the partition walls also inadvertently generates vacuum leakages in some cases.

SUMMARY (Item 1)
An exposure device may include a body tube that is depressurized to produce a vacuum state therein.
The exposure device may include a plurality of charged particle beam sources that are provided in the body tube, and emit a plurality of charged particle beams in a direction of extension of the body tube.
The exposure device may include a plurality of electromagnetic optical elements, each of which is provided corresponding to one of the plurality of charged particle beams in the body tube, and controls the one of the plurality of charged particle beams.
The exposure device may include a first partition wall and a second partition wall that are arranged separately from each other in the direction of extension in the body tube, and form a non-vacuum space between at least parts of the first partition wall and the second partition wall.

The exposure device may include a supporting unit that is provided in the body tube, and supports the plurality of electromagnetic optical elements for positioning of the plurality of electromagnetic optical elements.
(Item 2)
The exposure device may include a wire that is provided in the non-vacuum space located between the first partition wall and the second partition wall, and is electrically connected to at least some of the plurality of electromagnetic optical elements.
(Item 3)
In the direction of extension, the supporting unit may be arranged between the first partition wall and the second partition wall.
(Item 4)
In the direction of extension, the plurality of electromagnetic optical elements may be arranged between the first partition wall and the second partition wall.
(Item 5)
The plurality of electromagnetic optical elements may be arranged in the non-vacuum space located between the first partition wall and the second partition wall.
(Item 6)
The exposure device may include a plurality of cylindrical members that are provided corresponding to the plurality of charged particle beams, and penetrate the first partition wall, the supporting unit, and the second partition wall.
(Item 7)
Each of the plurality of cylindrical members may be fixed to the supporting unit.
(Item 8)
Each of the plurality of cylindrical members, and each of the first partition wall and the second partition wall may be sealed together by a vacuum seal.
(Item 9)
Each of the plurality of cylindrical members, and each of the first partition wall and the second partition wall may be sealed together such that the first partition wall and the second partition wall can be deformed along the cylindrical member depending on a pressure difference.
(Item 10)
Each of the plurality of cylindrical members may be fixed to one of the first partition wall and the second partition wall, and the cylindrical member and the other of the first partition wall and the second partition wall may be sealed together such that the other of the first partition wall and the second partition wall can be deformed along the cylindrical member depending on a pressure difference.
(Item 11)
In an area that extends from an end portion of each of the plurality of cylindrical members on a side closer to the first partition wall, and terminates at or before a location where a vacuum seal that seals together the cylindrical member and the first partition wall is to be provided, the cylindrical member may have a circumferential length that is shorter than circumferential lengths of the cylindrical member between the first partition wall and the second partition wall.
In an area that extends from an end portion of each of the plurality of cylindrical members on a side closer to the second partition wall, and terminates at or before a location where a vacuum seal that seals together the cylindrical member and the second partition wall is to be provided, the cylindrical member may have a circumferential length that is shorter than circumferential lengths of the cylindrical member between the first partition wall and the second partition wall.

(Item 12)

Each of the plurality of electromagnetic optical elements may be provided at an outer circumference of one of the plurality of cylindrical members.

(Item 13)

Each of the plurality of electromagnetic optical elements may have a main body portion fixed to the supporting unit.

Each of the plurality of electromagnetic optical elements may have a first extending portion that extends from a side of the main body portion closer to the first partition wall, penetrates the first partition wall, and has a cross-section taken perpendicular to the direction of extension that is smaller than a cross-section of the main body portion.

Each of the plurality of electromagnetic optical elements may have a second extending portion that extends from a side of the main body portion closer to the second partition wall, penetrates the second partition wall, and has a cross-section taken perpendicular to the direction of extension that is smaller than a cross-section of the main body portion.

(Item 14)

The first extending portion, and the first partition wall may be sealed together by a vacuum seal.

The second extending portion, and the second partition wall may be sealed together by a vacuum seal.

(Item 15)

In the direction of extension, the supporting unit may be provided opposite the second partition wall while sandwiching the first partition wall.

In the direction of extension, the supporting unit may be provided opposite the first partition wall while sandwiching the second partition wall.

(Item 16)

The exposure device may include a plurality of cylindrical members that are provided corresponding to the plurality of charged particle beams, fixed to the supporting unit, and penetrate the supporting unit, the first partition wall, and the second partition wall.

(Item 17)

In the non-vacuum space located between the first partition wall and the second partition wall, each of the plurality of electromagnetic optical elements may be fixed to one of the plurality of cylindrical members.

(Item 18)

Each of the plurality of cylindrical members, and each of the first partition wall and the second partition wall may be sealed together by a vacuum seal.

(Item 19)

Each of the plurality of electromagnetic optical elements may be provided in a vacuum space located between the supporting unit, and each of the first partition wall and the second partition wall.

Each of the plurality of electromagnetic optical elements may be electrically connected to a wire provided in the non-vacuum space located between the first partition wall and the second partition wall.

(Item 20)

The exposure device may include a plurality of cylindrical members that are provided corresponding to the plurality of charged particle beams, fixed to the supporting unit, and penetrate the supporting unit, the first partition wall, and the second partition wall.

(Item 21)

The exposure device may include a second supporting unit that is provided opposite the supporting unit while sandwiching the first partition wall and the second partition wall, and fixes each of the plurality of cylindrical members.

(Item 22)

The exposure device may include a plurality of units each having a frame constituting part of the body tube, the plurality of units being stacked one on another in the direction of extension of the body tube.

A first unit in the plurality of units may have the first partition wall, the second partition wall, and the supporting unit that are fixed inside the frame.

(Item 23)

A second unit adjacent to the first unit in the plurality of units may not have a blocking object between the plurality of charged particle beams that pass through the second unit.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
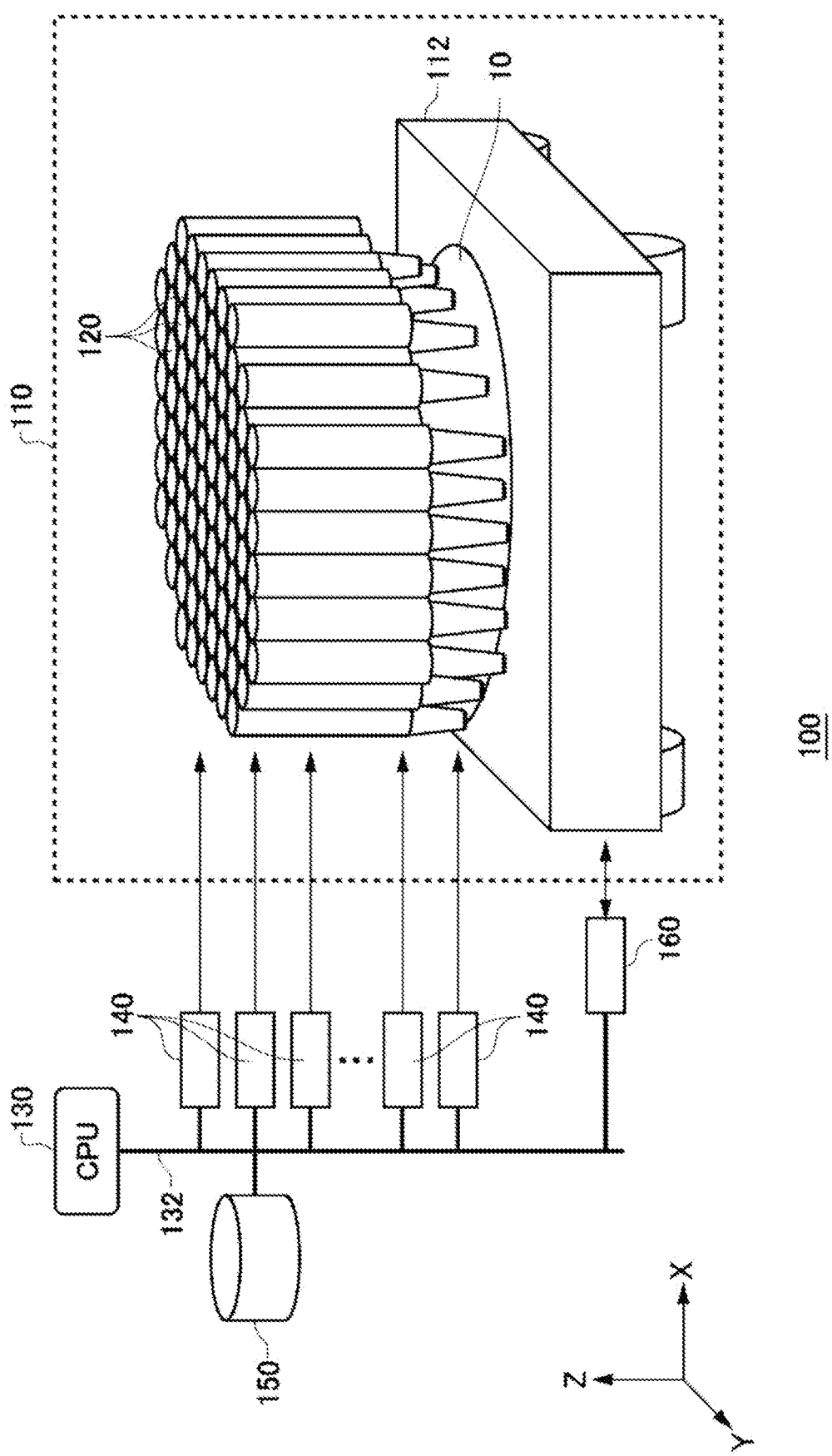
FIG. 1 illustrates an exemplary configuration of an exposure device 100 according to the present embodiment.

FIG. 1 illustrates an exemplary configuration of an exposure device 100 according to the present embodiment. The exposure device 100 generates a plurality of electron beams, and draws circuit patterns or the like on a sample 10 by using each beam. The exposure device 100 includes a body tube 110, a CPU 130, a bus 132, exposure control units 140, a storage unit 150 and a stage control unit 160.

The body tube 110 is depressurized to produce a vacuum state therein. The body tube 110 functions as a multi-electron beam column that generates a plurality of electron beams, and irradiates the sample 10 with the electron beams. That is, the body tube 110 has a plurality of electron beam generating units 120, and a stage unit 112 on which the sample 10 is placed.

Each of the electron beam generating units 120 generates a charged particle beam having electrons, ions or the like, and irradiates the sample 10 placed on the stage unit 112 with the charged particle beam. The present embodiment explained represents an example in which the electron beam generating units 120 generate electron beams. The number of electron beam generating units 120 is desirably as large as possible, and there are desirably several dozen electron beam generating units or more, for example. The number of electron beam generating units 120 is about one hundred, for example. The number of electron beam generating units 120 is 88, for example. In this case, the 88 electron beam generating units 120 may be arranged at pitches of approximately 30 mm on the X-Y plane. The plurality of electron beam generating units 120 are desirably arranged such that they are able to irradiate the entire surface of the sample 10 within the movable range of the stage unit 112.

FIG. 1 illustrates an example in which each of the electron beam generating units 120 generates an electron beam in a direction approximately parallel to the Z-axis direction. Each of the electron beam generating units 120 produces an electron beam with a predetermined shape. For example, the electron beam generating units 120 each produce an electron beam which collectively forms an array-like electron beam in which electron beams are arrayed in a predetermined one-dimensional direction. In this case, the exposure device 100 may expose the sample 10 to a pattern of the plurality of electron beams by switchingly and individually selecting whether to perform irradiation of a surface of the sample 10 with each of the plurality of electron beams (ON-state) or not to perform irradiation of the surface of the sample 10 with the electron beam (OFF-state) while moving the stage unit 112. The electron beam generating units 120 are mentioned below.

The stage unit 112 moves the sample 10 while the sample 10 is placed thereon. Here, the sample 10 may be a substrate formed of a semiconductor, glass, ceramic and/or the like, and for example is a semiconductor wafer formed of silicon or the like. The sample 10 may be a semiconductor wafer with diameter of approximately 300 mm. The sample 10 is a substrate having a surface on which a line pattern is formed with a conductor such as a metal, for example. In this case, the exposure device 100 may expose a resist formed on the line pattern to electron beams in order to make cuts along the line pattern to perform fine machining (formation of an electrode, a wire, a via and/or the like).

The stage unit 112 has the sample 10 mounted thereon, and moves the sample 10 on a predetermined plane. FIG. 1 illustrates an example in which the stage unit 112 moves the sample 10 on a plane approximately parallel to the X-Y plane. The stage unit 112 may be an XY-stage, and may be an XY-stage combined with one or more of a Z-stage, a rotational stage and a tilt stage. The stage unit 112 desirably includes a stage position detecting unit that detects the position of the stage unit 112. For example, the stage position detecting unit detects the position of the stage by irradiating the moving stage with laser light, and detecting reflected light. The stage position detecting unit desirably detect the position of the stage with precision of approximately 1 nm or smaller.

The CPU 130 controls the overall operation of the exposure device 100. The CPU 130 may have the function of an input terminal through which a manipulation instruction from a user is input. The CPU 130 may be a computer, a workstation, or the like. The CPU 130 may be connected to the exposure control units 140, and control exposure operations of the exposure device 100 according to user input. For example, the CPU 130 is connected to each of the exposure control units 140, the storage unit 150, and the stage control unit 160 via the bus 132, and exchanges control signals or the like with them.

A plurality of exposure control units 140 are provided, each of which is connected to a corresponding electron beam generating unit 120. Each of the exposure control units 140 controls a corresponding electron beam generating unit 120 to execute an exposure operation on the sample 10 according to a control signal received from the CPU 130, or the like. In addition, the exposure control units 140 may be connected to the storage unit 150 via the bus 132, and exchange data of patterns stored in the storage unit 150, or the like.

The storage unit 150 stores patterns that the exposure device 100 uses for exposure. For example, the storage unit 150 stores a cut pattern that the exposure device 100 uses for exposure in order to make cuts on the sample 10 along a line pattern formed thereon. In addition, the storage unit 150 may store a via pattern that the exposure device 100 uses for exposure in order to form vias on the sample 10. For example, the storage unit 150 receives information about cut patterns and via patterns from the outside via a network or the like, and stores them. In addition, the storage unit 150 may receive information about cut patterns and via patterns input by a user via the CPU 130, and stores them.

In addition, the storage unit 150 may store arrangement information about the sample 10, and information about a line pattern formed on the sample 10. Before starting an exposure operation, the storage unit 150 may store, as arrangement information, a measurement result obtained through measurement performed in advance. For example, the storage unit 150 may store, as arrangement information about the sample 10, information that become causes of positioning errors such as shrinkage ratios (deformation errors due to manufacturing processes) of the sample 10, rotational errors due to transfer or the like, distortion of substrates or the like, and height distribution.

In addition, the storage unit 150 may store, as line pattern arrangement information, information related to positional discrepancies between the irradiation positions of a plurality of electron beams and the position of a line pattern. The storage unit 150 desirably treats, as arrangement information, arrangement information about the sample 10 and line pattern arrangement information that are acquired by performing measurement of the sample 10 placed on the stage unit 112. Instead of this, the storage unit 150 may store past measurement results about the sample 10, measurement results of other samples in the same lot, or the like.

The stage control unit 160 is connected to the stage unit 112, and controls operations of the stage unit 112. According to control signals received from the CPU 130, or the like, the stage control unit 160 moves the stage unit 112, and controls the positions on the sample 10 that are irradiated by the electron beam generating units 120. For example, the stage control unit 160 moves the irradiation positions of a plurality of electron beams along the longitudinal direction of a line pattern of the sample 10.

The stage control unit 160 in the present embodiment may move the stage unit 112 on which the sample 10 is mounted approximately in parallel to the X-direction to thereby move the irradiation positions of a plurality of electron beams along the longitudinal direction of a line pattern. In addition, the stage control unit 160 may move the irradiation positions of a plurality of electron beams also in the width direction of a line pattern to move the irradiation positions of the plurality of electron beams so as to make predetermined areas on a surface of the sample 10 areas that can be irradiated by individual electron beams.

In the exposure device 100 according to the present embodiment mentioned above, the plurality of electron beam generating units 120 expose the entire surface of the sample 10 to electron beams. The plurality of electron beam generating units 120 may execute exposure operations temporally in parallel. Individual ones of the electron beam generating units 120 may be able to separately and independently expose predetermined areas on a surface of the sample 10 to electron beams. Thereby, for example, the exposure device 100 can expose 88 areas each with an area of 30 mm×30 mm on a surface of the sample 10 to electron beams in a period during which one electron beam generating unit 120 exposes a square area with an area of 30 mm×30 mm to an electron beam.

In this manner, the exposure device 100 according to the present embodiment can improve the throughput of exposure about several dozen times to a hundred times as compared with an exposure device having a single electron beam generating unit. In this manner, the exposure device 100 can adjust the throughput of exposure by increasing or reducing the number of electron beam generating units 120. Accordingly, even if the sample 10 is a semiconductor wafer or the like having a diameter larger than 300 mm, the exposure device 100 can prevent deterioration of throughput by further increasing the number of electron beam generating units 120. In addition, if the diameters of electron beam generating units 120 can be reduced further, the exposure device 100 may have a still higher throughput by having more densely arranged electron beam generating units 120.

The body tube 110 of such an exposure device 100 includes therein a plurality of areas of electronic circuits which operate in an environment approximately the same as an atmospheric pressure environment, and a plurality of vacuum areas where electron beams are generated, accelerated and concentrated. The inner space of such a body tube 110 is explained next.

Figure 2:
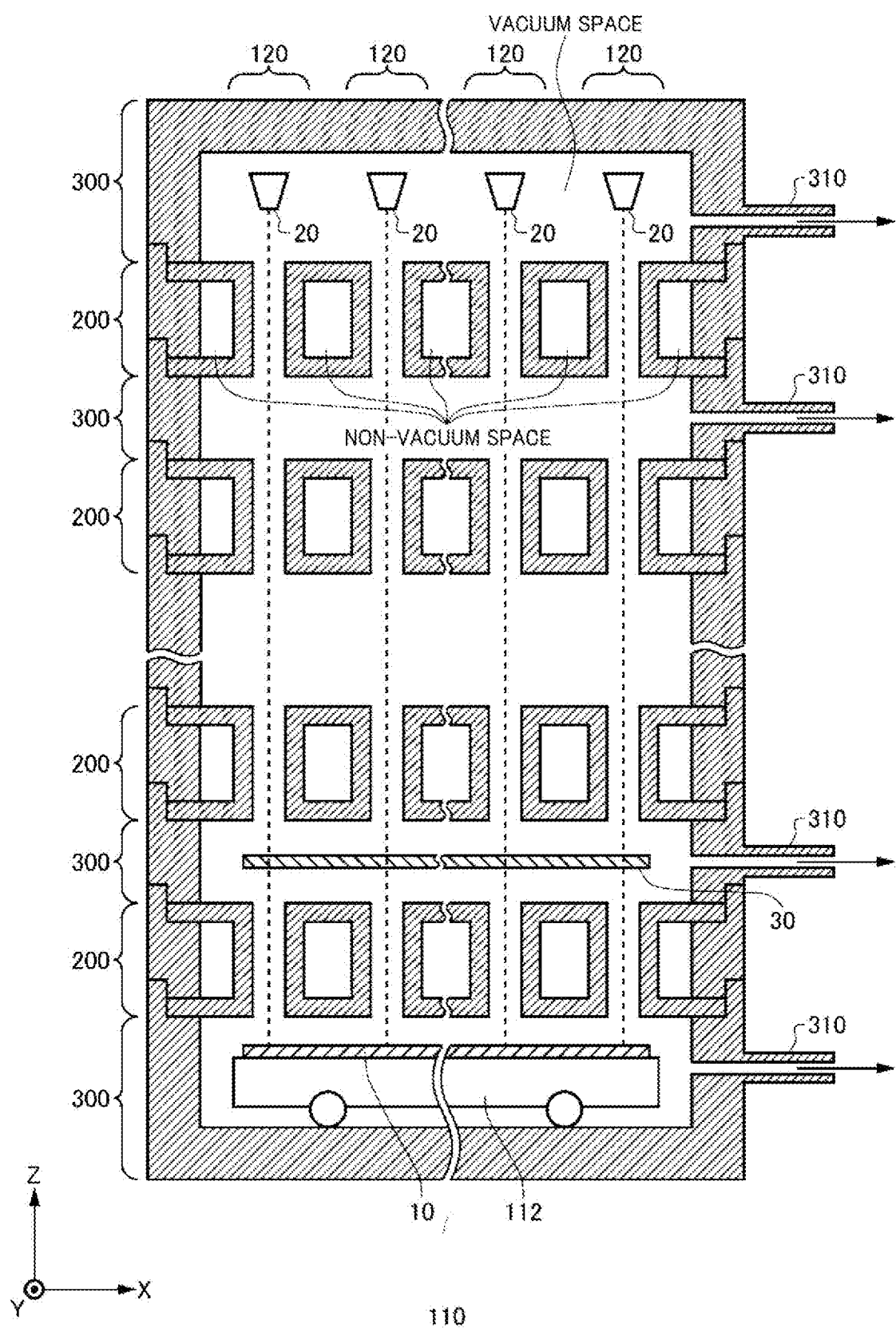
FIG. 2 illustrates an exemplary configuration of a body tube 110 according to the present embodiment.

FIG. 2 illustrates an exemplary configuration of the body tube 110 according to the present embodiment. FIG. 2 illustrates an exemplary cross-sectional view of the body tube 110 which extends approximately in parallel to the Z-axis direction, taken along a plane approximately parallel to the Z-X-plane. As explained with reference FIG. 1 also, the body tube 110 is provided with the stage unit 112 therein on which the sample 10 is placed, and uses a plurality of electron beams to draw a drawing pattern on the sample 10. The body tube 110 includes a plurality of charged particle beam sources 20, a blanking unit 30, first units 200, second units 300, and exhausting openings 310.

The plurality of charged particle beam sources 20 are provided in the body tube 110, and emit a plurality of charged particle beams in a direction of extension of the body tube 110. Each of the charged particle beam sources 20 is an electron gun that emits electrons by means of an electrical field or heat, for example. In this case, the charged particle beam source 20 may apply a predetermined electrical field to emitted electrons to output an electron beam accelerated toward the sample 10 in the −Z-direction in FIG. 1. The charged particle beam source 20 may apply a predetermined accelerating voltage (e.g., 50 kV) to output an electron beam. Note that in the present embodiment explained, electron beams are used as an example of charged particle beams.

The charged particle beam sources 20 may each be provided on a perpendicular line that extends from the surface of the sample 10 approximately parallel to the X-Y plane, and is parallel to the Z axis. That is, the plurality of charged particle beam sources 20 may be arrayed at predetermined intervals approximately in parallel to the X-Y plane. The plurality of charged particle beam sources 20 may be arrayed in a grid or concentrically. An approximately constant accelerating voltage may be applied to the plurality of charged particle beam sources 20.

In this case, the plurality of charged particle beam sources 20 may not be housed individually inside partition walls or the like. Since the body tube 110 does not have to have a body tube formed for each charged particle beam source 20 as illustrated in FIG. 1, the plurality of charged particle beam sources 20 can be arranged more densely. For example, the arrangement intervals of the plurality of charged particle beam sources 20 in one direction within the body tube 110 can be set to about 30 mm. That is, a cylindrical area inside the body tube 110 which includes a charged particle beam source 20, and extends approximately in parallel to the Z-direction is equivalent to an electron beam generating unit 120. In this case, the diameter of the cylindrical area is about 30 mm, for example.

The blanking unit 30 switches whether to or not to irradiate the sample 10 with each of the plurality of charged particle beams. That is, the blanking unit 30 switches whether to or not to deflect each of the electron beams in a direction different from the direction of the sample 10. The blanking unit 30 may have: a plurality of openings each arrayed corresponding to one of the electron beams; and a plurality of blanking electrodes that apply electrical fields into the plurality of openings.

The plurality of openings may allow the passage of individual ones of the electron beams therethrough individually. For example, since if a voltage is not supplied to a blanking electrode, no electrical fields to be applied to an electron beam are generated in a corresponding opening, the electron beam entering the opening is not deflected, but passes through the opening toward the sample 10 (this state is called the beam ON-state). In addition, since if a voltage is supplied to the blanking electrode, an electrical field is generated in the corresponding opening, the electron beam entering the opening is deflected in a direction different from the direction in which the electron beam advances when it passes through the opening toward the sample 10 (this state is called the beam OFF-state). The voltage to switch the state of an electron beam between the ON-state and the OFF-state may be supplied from a corresponding exposure control unit 140 to a blanking electrode.

Here, the space in which an electron beam travels from a charged particle beam source 20 until it reaches the sample 10 via the blanking unit 30 is desirably kept at a predetermined degree of vacuum. In addition, an electromagnetic optical element that causes acceleration, concentration, deflection or the like of an electron beam is provided along the space in which the electron beam travels. Since the electromagnetic optical element includes a coil or the like to generate a flow of current, it is desirably provided in a space which is at about atmospheric pressure.

Since the body tube 110 generates a plurality of electron beams, and irradiates the sample 10 with the plurality of electron beams separately and independently, a plurality of such vacuum areas and non-vacuum areas are provided. Note that the vacuum areas are kept at a degree of vacuum which allows drawing by using electron beams. The vacuum areas are kept at a high degree of vacuum which is $10^{-7}$ Pa to $10^{-8}$ Pa, for example. In addition, the non-vacuum areas may be at about 1 atm. In addition, the non-vacuum areas may be areas at a low degree of vacuum lower than atmospheric pressure provided that the low degree is within a range of degrees of vacuum that allow normal operation of electronic circuits in the body tube 110. That is, the non-vacuum areas may be kept at 100 Pa or higher, for example.

In order to form such a body tube 110 easily, the body tube 110 according to the present embodiment may be constituted by a plurality of separate units, and unit-by-unit formation and adjustment may be possible. The plurality of units may be stacked one on another in the direction of extension of the body tube 110. The body tube 110 includes a plurality of first units 200, and a plurality of second units 300, for example.

A first unit 200 has a vacuum space which serves as a vacuum area during operation of the exposure device, and a non-vacuum space which serves as a non-vacuum area during the operation. The first unit 200 allows the passage of an electron beam through the vacuum space, and is provided with an electromagnetic optical element in the non-vacuum space. The first unit 200 is provided with a partition wall or the like between the vacuum space and the non-vacuum space, and is thereby separated to form those two spaces. Note that the non-vacuum space formed in each of the first units 200 may form an integrated space, or, instead of this, may together form a plurality of spaces.

A second unit 300 has a vacuum space which serves as a vacuum area during operation of the exposure device. The vacuum spaces of individual ones of the plurality of first units 200 and the plurality of second units 300 may form an integrated space. In this case, the integrated space may serve as an area through which electron beams are allowed to pass, an area where the charged particle beam sources 20, blanking unit 30, stage unit 112 and the like, are housed, or the like.

That is, the second units 300 do not have blocking objects arranged between a plurality of charged particle beams that pass through the second units 300. The second units 300 may be hollow units. The second units 300 have exhausting openings 310, and are connected to an exhausting device such as an external vacuum pump. All the second units 300 may have exhausting openings 310, or, instead of this, some of the second units 300 may have exhausting openings 310.

The body tube 110 mentioned above may have the first units 200 and the second units 300 that are stacked one on another alternately. For example, a first unit 200 provided with an electromagnetic optical element is provided on a second unit 300 that houses the stage unit 112, and a second unit 300 that houses the blanking unit 30 may be provided on the first unit 200. The body tube 110 may be formed of multiple stages of units that are stacked one on another in this manner. For example, the body tube 110 has about seven or eight first units 200, and about seven or eight second units 300 that are stacked one on another alternately.

Here, the vacuum space of a first unit 200 may not be provided with a partition wall or the like between the vacuum space and the vacuum space of an adjacent second unit 300. That is, the vacuum spaces in the body tube 110 may be formed integrally. In addition, in this case, the vacuum spaces of a plurality of units may form part of the integrally formed vacuum space. In addition, the non-vacuum spaces of first units 200 may form spaces that are independent unit-by-unit in the body tube 110. Such a plurality of units are explained next.

Figure 3:
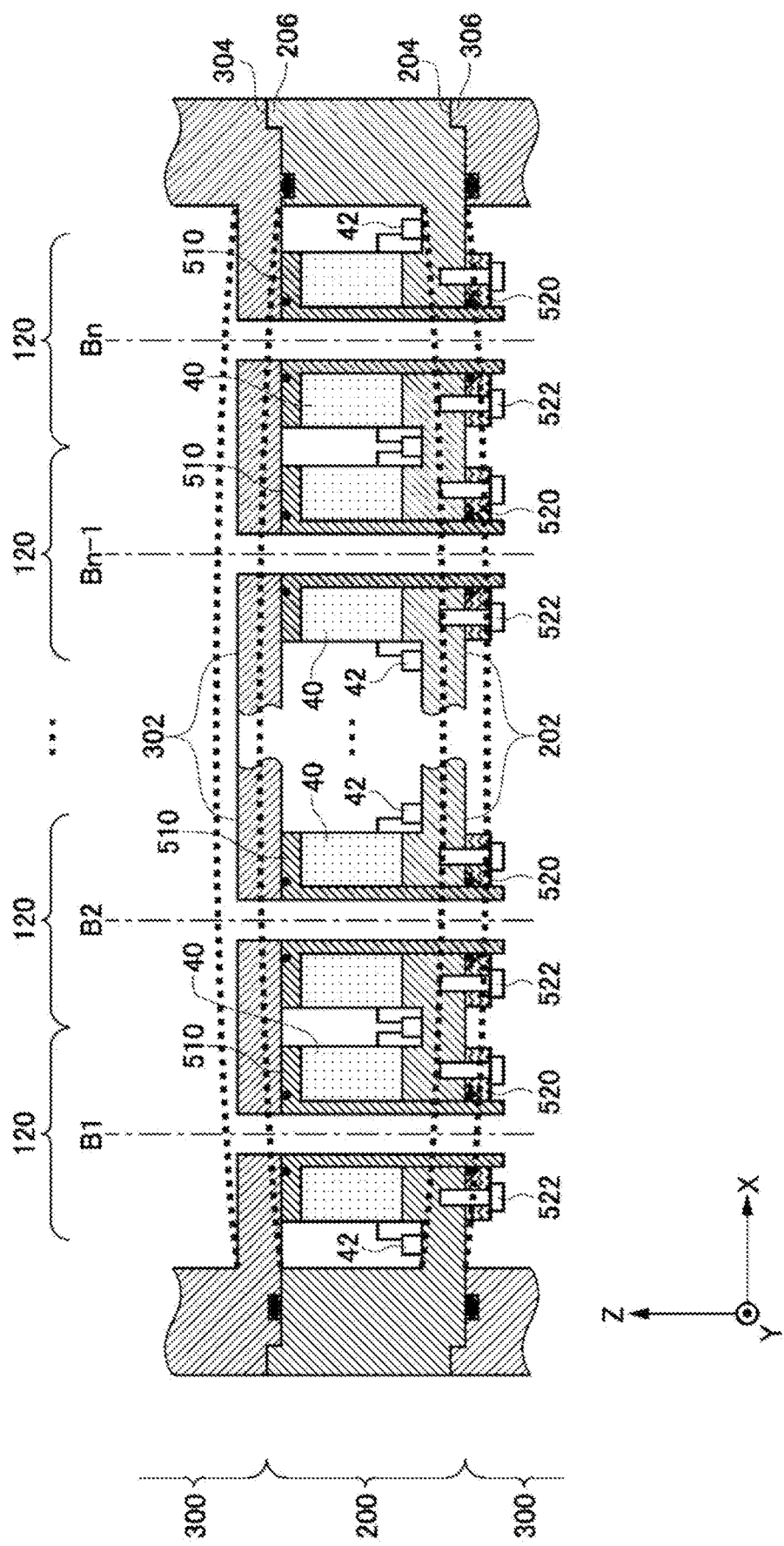
FIG. 3 illustrates an exemplary comparative configuration of a first unit 200 and second units 300 according to the present embodiment.

FIG. 3 illustrates an exemplary comparative configuration of a first unit 200 and second units 300 according to the present embodiment. FIG. 3 illustrates an exemplary cross-sectional view of the body tube 110 taken along a plane approximately parallel to the Z-X-plane. That is, FIG. 3 illustrates an exemplary cross-sectional view showing an enlarged view of part of the cross-sectional view illustrated in FIG. 2. In FIG. 3, exemplary ideal paths of electron beams are indicated by alternate long and short dash lines $B_1$ to $B_n$.

The first unit 200 in the exemplary comparative configuration has a bottom portion 202 on the sample 10 side. In addition, a surface of the bottom portion 202 facing the sample 10 may have a recessed portion 204 formed thereon. In addition, the first unit 200 may have a protruding portion 206 protruding away from the sample 10. Similarly, a second unit 300 in the exemplary comparative configuration has a bottom portion 302 on the sample 10 side. In addition, a surface of the bottom portion 302 facing the sample 10 may have a recessed portion 304 formed thereon. In addition, a second unit 300 may have a protruding portion 306 protruding away from the sample 10.

Such recessed portions and protruding portions of individual units are used for positioning of the units in place when they are stacked one on another. For example, a first unit 200 is stacked on a second unit 300 such that the protruding portion 306 of the second unit 300 mates with the recessed portion 204 of the first unit 200. In addition, a second unit 300 may be stacked on a first unit 200 such that the protruding portion 206 of the first unit 200 mates with the recessed portion 304 of the second unit 300. Note that O-rings or the like may be provided between individual units so as to maintain airtightness therebetween.

FIG. 3 illustrates an example in which recessed portions are provided at bottom portions of individual units, this is not the sole example. It is only required that a shape that allows mating of adjacent units for positioning be formed in one of or both the units. Among a plurality of units that are stacked one on another in this manner, first units 200 having non-vacuum spaces have electromagnetic optical elements 40 arranged therein. That is, a first unit 200 has electromagnetic optical elements 40, wires 42, partition wall portions 510, flanges 520, and fixation screws 522.

A plurality of the partition wall portions 510 are each arranged to surround an ideal path B of an electron beam inside the first unit 200. The plurality of partition wall portions 510 are each fixed to the bottom portion 202 of the first unit 200 and the bottom portion 302 of the second unit 300. For example, the bottom portion 202 has a plurality of through-holes into which the partition wall portions 510 are inserted. The partition wall portions 510 are inserted into the through-holes, and may be fixed by flanges 520 and fixation screws 522 at a surface of the bottom portion 202 facing the sample 10. Note that desirably O-rings are provided between the bottom portion 202, partition wall portions 510, and flanges 520.

Each of the partition wall portions 510 may have a junction interface that is approximately parallel to the X-Y plane, and faces away from the sample 10. Desirably, the partition wall portions 510 are arranged such that, if the second unit 300 is stacked on the first unit 200, the junction interface of each of the partition wall portions 510 comes into contact with a surface of the bottom portion 302 of the second unit 300 facing the sample 10. Note that desirably O-rings are provided between the partition wall portions 510 and the bottom portion 302. The partition wall portions 510 may be formed of a non-magnetic metal. In addition, the partition wall portions 510 may be conductive ceramics or ceramics having a conductive coating formed on an inner circumferential surface thereof.

The electromagnetic optical elements 40 may each be provided to surround such a partition wall portion 510. The electromagnetic optical elements 40 are each provided corresponding to one of a plurality of electron beams to pass through the vacuum areas, and generate magnetic fields to individual electron beams to control them individually. The electromagnetic optical elements 40 include at least one of electromagnetic lenses, electromagnetic deflectors, electromagnetic compensators, and the like, for example. Such electromagnetic optical elements 40 generate magnetic fields, and may execute convergence, deflection, aberration compensation or the like on electron beams.

The electromagnetic optical elements 40 have coils and/or magnetic substances for generating magnetic fields. Since such electromagnetic optical elements 40 cause currents to flow for the purpose of generating magnetic fields, they start firing in some cases if they cannot exhaust heat when arranged in vacuum areas where electron beams pass through. In addition, if the electromagnetic optical elements 40 include coil turns or magnetic substance portions, these members cause degassing due to heat-generation or the like. Accordingly, since if the electromagnetic optical elements 40 are arranged in vacuum areas, they inadvertently cause firing, deterioration of the degree of vacuum and the like in some cases, the electromagnetic optical elements 40 are desirably arranged in non-vacuum spaces formed by the partition wall portions 510 and the like.

The electromagnetic optical elements 40 and partition wall portions 510 are desirably formed axially symmetrically about the ideal paths B of electron beams. For example, the electromagnetic optical elements 40 have coil portions and magnetic substance portions. For example, a coil portion includes turns wound around the central axis. In addition, a magnetic substance portion includes a magnetic substance member that surrounds the coil portion, and is axially symmetric about the central axis, and gaps provided at a part of the magnetic substance member. Such electromagnetic optical elements 40 generate local magnetic fields in the central axis direction in the vacuum areas that are surrounded by the electromagnetic optical elements 40 via the partition wall portions 510. That is, in this case, the electromagnetic optical elements 40 function as electromagnetic lenses that converge electron beams passing through the first unit 200 along paths approximately coinciding with the paths B.

In addition, the electromagnetic optical elements 40 may be have coil portions and/or magnetic substance portions that are arranged axially symmetrically about the paths B. The electromagnetic optical elements 40 may function as electromagnetic deflectors from which axially asymmetric magnetic fields are generated, and which change the advancing directions of electron beams according to currents flowing through the coil portions. In addition, the electromagnetic optical elements 40 may function as electromagnetic compensators to compensate for aberrations of electron beams. The electromagnetic optical elements 40 may cause currents to flow via the wires 42. The wires 42 are provided in the non-vacuum spaces, and are electrically connected to at least some of the plurality of electromagnetic optical elements 40. The wires 42 are electrically connected to components outside the body tube 110.

The first unit 200 in the exemplary comparative configuration mentioned above is desirably stacked on a second unit after the plurality of partition wall portions 510 are fixed to the bottom portion 202. That is, the first unit 200 may be stacked on the second unit 300 after the inner structure of the first unit 200 is assembled. Then, by still another second unit 300 being stacked on the first unit 200, the vacuum spaces and non-vacuum spaces of the second unit 300 may be formed as illustrated in FIG. 3. That is, the first unit 200 is separated by the first unit 200, second units 300, and plurality of partition wall portions 510 to form two types of spaces, which are vacuum spaces and non-vacuum spaces. Note that the first unit 200 has a plurality of vacuum spaces formed therein corresponding to a plurality of electron beams.

In this manner, the body tube 110 can be formed precisely by executing the assembly and adjustment unit by unit, and stacking the units while positioning each one of them in place. However, even if the body tube 110 is assembled highly precisely at atmospheric pressure, partition walls or the like between non-vacuum areas and vacuum areas deform in some cases if the vacuum areas are formed by vacuum exhaustion through the exhausting openings 310. For example, the bottom portion 202 of the first unit 200 and the bottom portion 302 of the second unit 300 in the exemplary comparative configuration warp toward the vacuum areas as indicated by dotted lines in FIG. 3.

In this case, the partition wall portions 510 and electromagnetic optical elements 40 also move so that some or all of the optical systems of a plurality of electron beams change separately and independently in a complicated manner, and the precision of drawing a pattern on the sample 10 inadvertently lowers in some cases. In addition, such deformation of the bottom portion 202, bottom portion 302 and partition wall portions 510 inadvertently generates vacuum leakages. In view of this, by fixing the electromagnetic optical elements 40 separately from partition walls or the like, the exposure device 100 according to the present embodiment reduces variations of the optical systems even if the partition walls or the like are deformed. In addition, the exposure device 100 uses cylindrical members to thereby prevent occurrences of vacuum leakage even if the partition walls or the like are deformed. Each unit in a first exemplary configuration that constitutes the body tube 110 of such an exposure device 100 is explained next.

Figure 4:
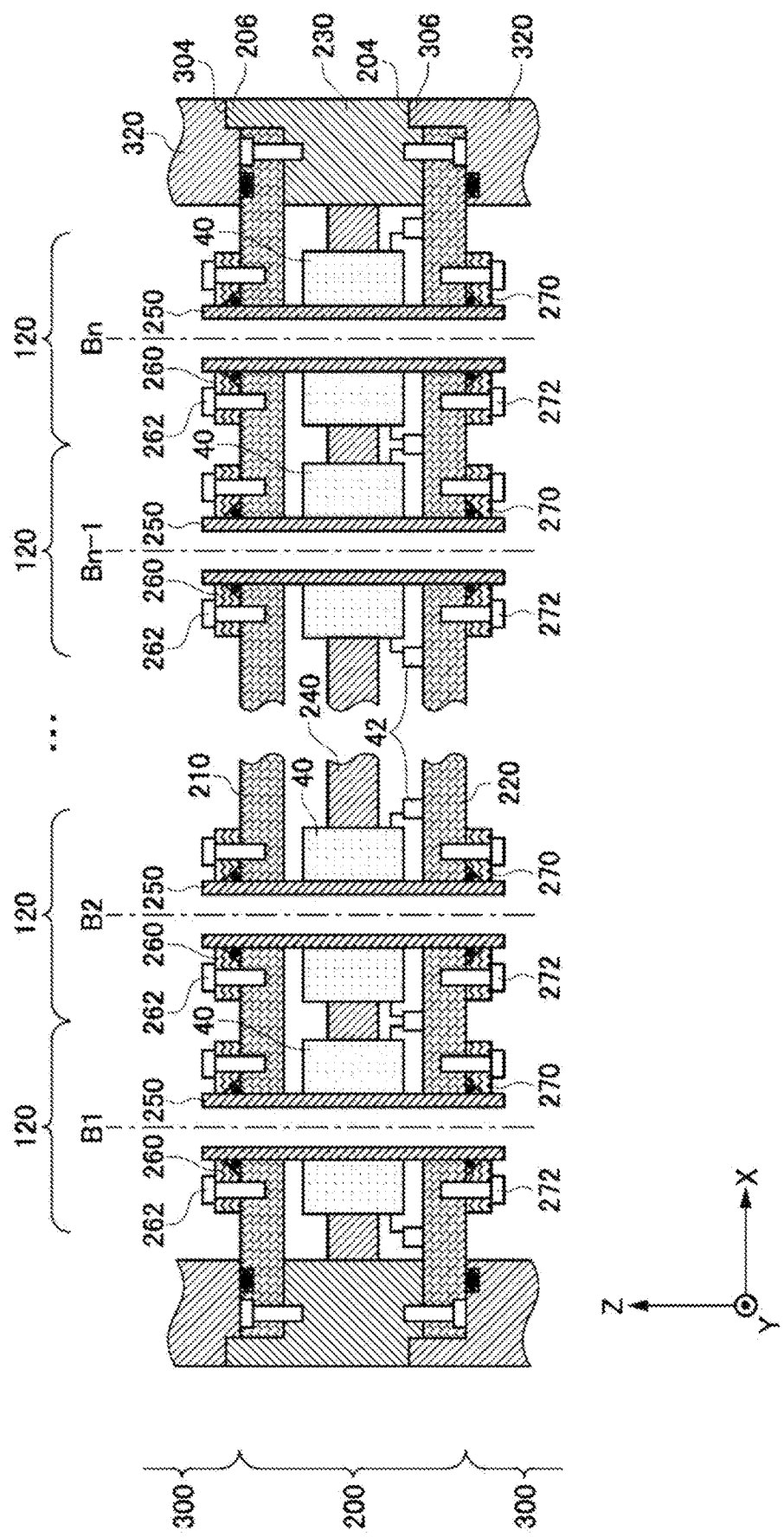
FIG. 4 illustrates a first exemplary configuration of the first unit 200 and second units 300 according to the present embodiment.

FIG. 4 illustrates a first exemplary configuration of the first unit 200 and second units 300 according to the present embodiment. Elements of the first unit 200 and second units 300 in the first exemplary configuration that operate in approximately the same manners as operations of the first unit 200 and second units 300 in the exemplary comparative configuration illustrated in FIG. 3 are given the same symbols, and explanations thereof are omitted. Similar to FIG. 3, FIG. 4 illustrates an exemplary cross-sectional view of the body tube 110 taken along a plane approximately parallel to the Z-X-plane.

Similar to the first unit 200 and second units 300 in the exemplary comparative configuration, the first unit 200 and second unit 300 in the first exemplary configuration are stacked one on another to form the body tube 110 like the one illustrated in FIG. 2. The first unit 200 includes the electromagnetic optical elements 40, the wires 42, a first partition wall 210, a second partition wall 220, a frame 230, supporting units 240, cylindrical members 250, first flanges 260, fixation screws 262, second flanges 270, and fixation screws 272.

The first partition wall 210 and the second partition wall 220 are arranged separately from each other in the direction of extension of the body tube 110 in the body tube 110, and form non-vacuum spaces between at least parts of them. The non-vacuum spaces may be spaces at atmospheric pressure, or instead of this may be space at low vacuum. The first partition wall 210 and second partition wall 220 are fixed inside the frame 230. The first partition wall 210 and second partition wall 220 may be formed of a non-magnetic metal. In addition, the first partition wall 210 and second partition wall 220 may be conductive ceramics or ceramics having conductive coatings formed on inner circumferential surfaces thereof.

The frame 230 is provided between the first partition wall 210 and the second partition wall 220. The frame 230 is formed in a cylindrical shape extending in the direction approximately parallel to the Z-axis direction, and forms part of the body tube 110. That is, a plurality of frames 230 each constitute part of the body tube 110. The frame 230 may have a recessed portion 204 formed on a surface of it facing the sample 10. The frame 230 may have a protruding portion 206 formed to protrude away from the sample 10. The frame 230 may contain iron or permalloy. The frame 230 is desirably formed of a member that prevents an external weak magnetic field from exerting influence on the inner space of the body tube 110.

The supporting units 240 are provided in the body tube 110, and support and position the plurality of electromagnetic optical elements 40 in place. The supporting units 240 are arranged between the first partition wall 210 and the second partition wall 220 in the direction of extension in the body tube 110. The supporting units 240 may be fixed to the frame 230. The supporting units 240 are desirably formed of a non-magnetic member.

By the supporting units 240 each positioning one of the plurality of electromagnetic optical elements 40 in place, the plurality of electromagnetic optical elements 40 are each provided corresponding to one of the plurality of charged particle beams in the body tube 110, and can control individual charged particle beams. In this case, the plurality of electromagnetic optical elements 40 are arranged between the first partition wall 210 and the second partition wall 220 in the direction of extension. In addition, the plurality of electromagnetic optical elements 40 are arranged in non-vacuum spaces located between the first partition wall 210 and the second partition wall 220. Accordingly, the wires 42 electrically connected to at least some of the plurality of electromagnetic optical elements 40 are also provided in the non-vacuum spaces located between the first partition wall 210 and the second partition wall 220.

The plurality of cylindrical members 250 are provided corresponding to a plurality of charged particle beams, and penetrate the first partition wall 210, supporting unit 240, and second partition wall 220. That is, each of the first partition wall 210, second partition wall 220, and supporting unit 240 has a plurality of through-holes that allow penetration therethrough of the cylindrical members 250. Each of the cylindrical members 250 has a hollow internal space to serve as a vacuum space, and allows the passage therethrough of an electron beam. Each of the plurality of cylindrical members 250 is fixed to the supporting unit 240.

That is, the supporting unit 240 fixes the electromagnetic optical elements 40, and cylindrical members 250 for positioning of them. For example, each of the plurality of electromagnetic optical elements 40 is provided at the outer circumference of one of the plurality of cylindrical members 250. In this case, the cylindrical members 250 may be fixed by penetrating the through-holes of the supporting unit 240 along with the electromagnetic optical elements 40. Instead of this, only the cylindrical members 250 may penetrate the through-holes of the supporting unit 240, and the electromagnetic optical elements 40 may be fixed around the cylindrical members 250.

Each of the plurality of cylindrical members 250, and each of the first partition wall 210 and the second partition wall 220 are sealed together by a vacuum seal. Each of the cylindrical member 250 may be sealed by using an elastic material such as an O-ring, for example. Thereby, the vacuum space inside the cylindrical member 250 can form a vacuum area, and remain in the vacuum state once vacuum-exhausted through an exhausting opening 310. Note that the vacuum spaces inside the cylindrical members 250 may be connected to vacuum spaces of two second units 300 that are laid on a side of the first unit 200 closer to the sample 10 in the direction of extension of the body tube 110, and on a side opposite to the sample 10, and may form vacuum areas with approximately the same degrees of vacuum.

Here, each of the plurality of cylindrical members 250, and each of the first partition wall 210 and the second partition wall 220 may be sealed together such that the first partition wall 210 and the second partition wall 220 can be deformed along the cylindrical member 250 depending on a pressure difference. For example, each of the cylindrical members 250, and the first partition wall 210 are sealed together by using a corresponding O-ring, first flange 260, and fixation screw 262. In this case, one cylindrical member 250, the first partition wall 210, and one first flange 260 may sandwich an O-ring, and a fixation screw 262 may fix the one first flange 260 and the first partition wall 210.

Similarly, each of the cylindrical members 250, and the second partition wall 220 may be sealed together by using a corresponding O-ring, second flange 270, and fixation screw 272. For example, one cylindrical member 250, the second partition wall 220, and one second flange 270 sandwich an O-ring, and a fixation screw 272 fixes the one second flange 270 and the second partition wall 220. The first unit 200 in the first exemplary configuration mentioned above is stacked between the second units 300 in the direction of extension of the body tube 110.

The second unit 300 in the first exemplary configuration includes the exhausting opening 310 and a frame 320. The frame 320 is formed in a cylindrical shape extending in the direction approximately parallel to the Z-axis direction, and forms part of the body tube 110. The frame 320 may contain iron or permalloy. The frame 320 is desirably formed of a member that prevents an external weak magnetic field from exerting influence on the inner space of the body tube 110.

A surface of the frame 320 facing the sample 10 may have the recessed portion 304 formed thereon. The first unit 200 and the second unit 300 may be positioned in place by the recessed portion 304 mating with the protruding portion 206 of the first unit 200. In addition, the frame 320 may have the protruding portion 306 formed to protrude away from the sample 10. The first unit 200 and the second unit 300 may be positioned in place by the protruding portion 306 mating with the recessed portion 204 of the first unit 200.

With the use of the first units 200 and second units 300 in the first exemplary configuration mentioned above, the exposure device 100 according to the present embodiment can be formed by stacking the first units 200 and second units 300 one on another while positioning the individual units in place, similar to the case where the first units 200 and second units 300 in the exemplary comparative configuration are used. That is, the body tube 110 can be formed precisely.

In addition, in the first unit 200 in the first exemplary configuration, the first partition wall 210 is deformed along the direction of extension of the plurality of cylindrical members 250 even if the first unit 200 is vacuum-exhausted through the exhausting opening 310, and the first partition wall 210 is deformed. That is, the electromagnetic optical elements 40, and cylindrical members 250 barely move in the body tube 110, and are positioned stably in place by the supporting unit 240. Accordingly, the exposure device 100 can keep the state where the optical systems for a plurality of electron beams are positioned in place, and can prevent the precision of drawing of patterns on the sample 10 from lowering.

Similarly, in the first unit 200 in the first exemplary configuration, the second partition wall 220 is deformed along the direction of extension of the plurality of cylindrical members 250 even if the first unit 200 is vacuum-exhausted through the exhausting opening 310, and the second partition wall 220 is deformed. That is, the electromagnetic optical elements 40, and cylindrical members 250 barely move in the body tube 110, and are positioned stably in place by the supporting unit 240. Accordingly, the exposure device 100 can keep the state where the optical systems for a plurality of electron beams are positioned in place, and can prevent the precision of drawing of patterns on the sample 10 from lowering.

In addition, in the first unit 200 in the first exemplary configuration, the first partition wall 210 and the second partition wall 220 can be deformed along the direction of extension of the cylindrical member 250 while at the same time keeping the state where the first partition wall 210 and the second partition wall 220 are sealed even if the first unit 200 is vacuum-exhausted through the exhausting opening 310. Accordingly, the exposure device 100 can prevent occurrences of vacuum leakage even if the first partition wall 210 and second partition wall 220 are deformed. In this manner, the exposure device 100 that uses the first unit 200 and second units 300 in the first exemplary configuration according to the present embodiment can be provided as a multi-beam exposure device that allows reduction of variations of the optical systems for electron beams, and also allows prevention of vacuum leakage.

Figure 5:
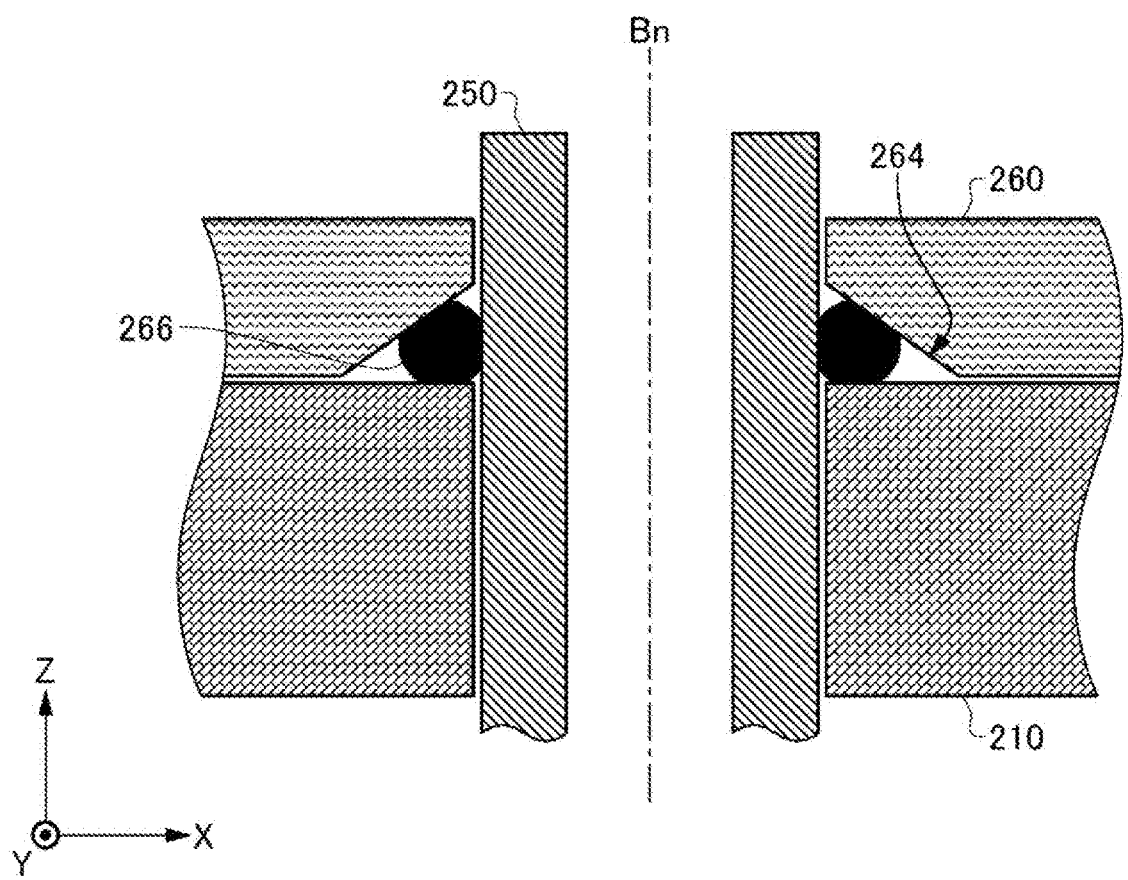
FIG. 5 illustrates a first exemplary configuration of a vacuum seal according to the present embodiment.

FIG. 5 illustrates a first exemplary configuration of a vacuum seal according to the present embodiment. FIG. 5 illustrates an exemplary enlarged view of FIG. 4. The cylindrical member 250 is provided with an O-ring 266 at part of its periphery. A first flange 260 has an inclined surface 264 that contacts the O-ring 266. That is, if the first flange 260 is fixed to the first partition wall 210 by using a fixation screw 262, the first partition wall 210, cylindrical member 250, and inclined surface 264 contact the O-ring 266 to form a vacuum seal.

Thereby, a vacuum space and a non-vacuum space may be separated. Note that, also at an end portion of the cylindrical member 250 on the opposite side, similarly, if a second flange 270 is fixed to the second partition wall 220 by using a fixation screw 272, the second partition wall 220, the cylindrical member 250, and an inclined surface of the second flange 270 may contact an O-ring 266 to form a vacuum seal.

Figure 6:
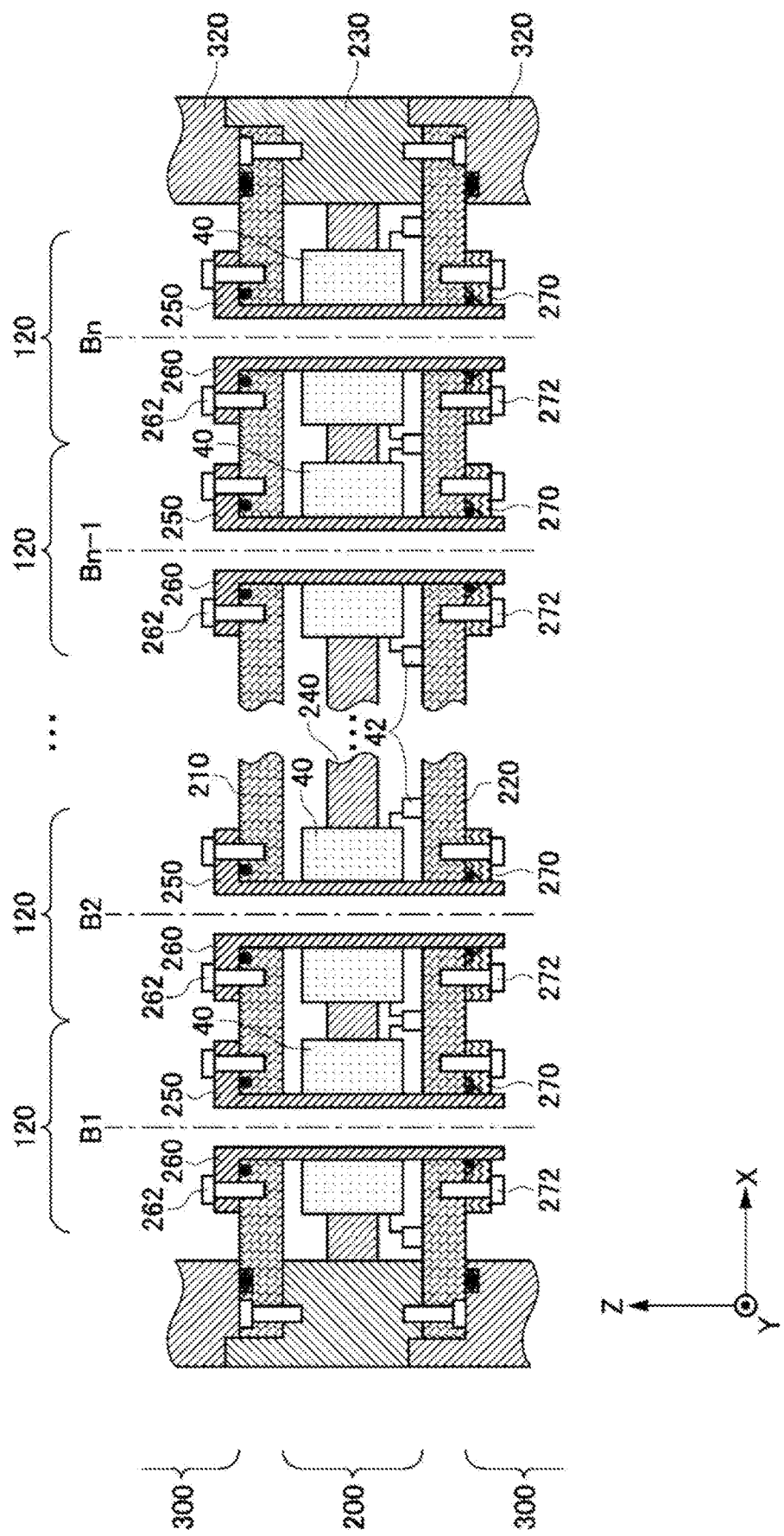
FIG. 6 illustrates a second exemplary configuration of the first unit 200 and second units 300 according to the present embodiment.

Although the first unit 200 in the first exemplary configuration mentioned above illustrates an example in which the first partition wall 210 and the second partition wall 220 are sealed to be deformable along the cylindrical member 250, this is not the sole example. Each of the plurality of cylindrical members 250 may be fixed to one of the first partition wall 210 and the second partition wall 220, and the other of the first partition wall 210 and the second partition wall 220 may be sealed to be deformable along the cylindrical member 250 depending on a pressure difference. FIG. 6 illustrates an example in which each of the plurality of cylindrical members 250 is fixed to the first partition wall 210.

FIG. 6 illustrates a second exemplary configuration of the first unit 200 and second units 300 according to the present embodiment. Elements of the first unit 200 and second units 300 in the second exemplary configuration that operate in approximately the same manners as operations of the first unit 200 and second units 300 in the first exemplary configuration illustrated in FIG. 4 are given the same symbols, and explanations thereof are omitted. Similar to FIG. 4, FIG. 6 illustrates an exemplary cross-sectional view of the body tube 110 taken along a plane approximately parallel to the Z-X-plane.

In the first unit 200 in the second exemplary configuration, each of the cylindrical members 250 has a first flange 260, and a fixation screw 262 fixes the cylindrical member 250 to the first partition wall 210. In this manner, even if the cylindrical member 250 is fixed on a side thereof closer to the first partition wall 210, the second partition wall 220 can be deformed along the cylindrical member 250, and so the exposure device 100 can keep the state where the optical systems for a plurality of electron beams are positioned in place. Similarly, even if each of the plurality of cylindrical members 250 is fixed to the second partition wall 220, the exposure device 100 can keep the state where the optical systems for a plurality of electron beams are positioned in place, provided that the first partition wall 210 can be deformed along the cylindrical member 250.

Although the first unit 200 in the first exemplary configuration, and second exemplary configuration mentioned above illustrates an example in which cylindrical members 250 penetrating the first unit 200 are provided, this is not the sole example. For example, some of the electromagnetic optical elements 40 may be configured to penetrate the first partition wall 210 and/or the second partition wall 220. Such an exemplary configuration is explained next.

Figure 7:
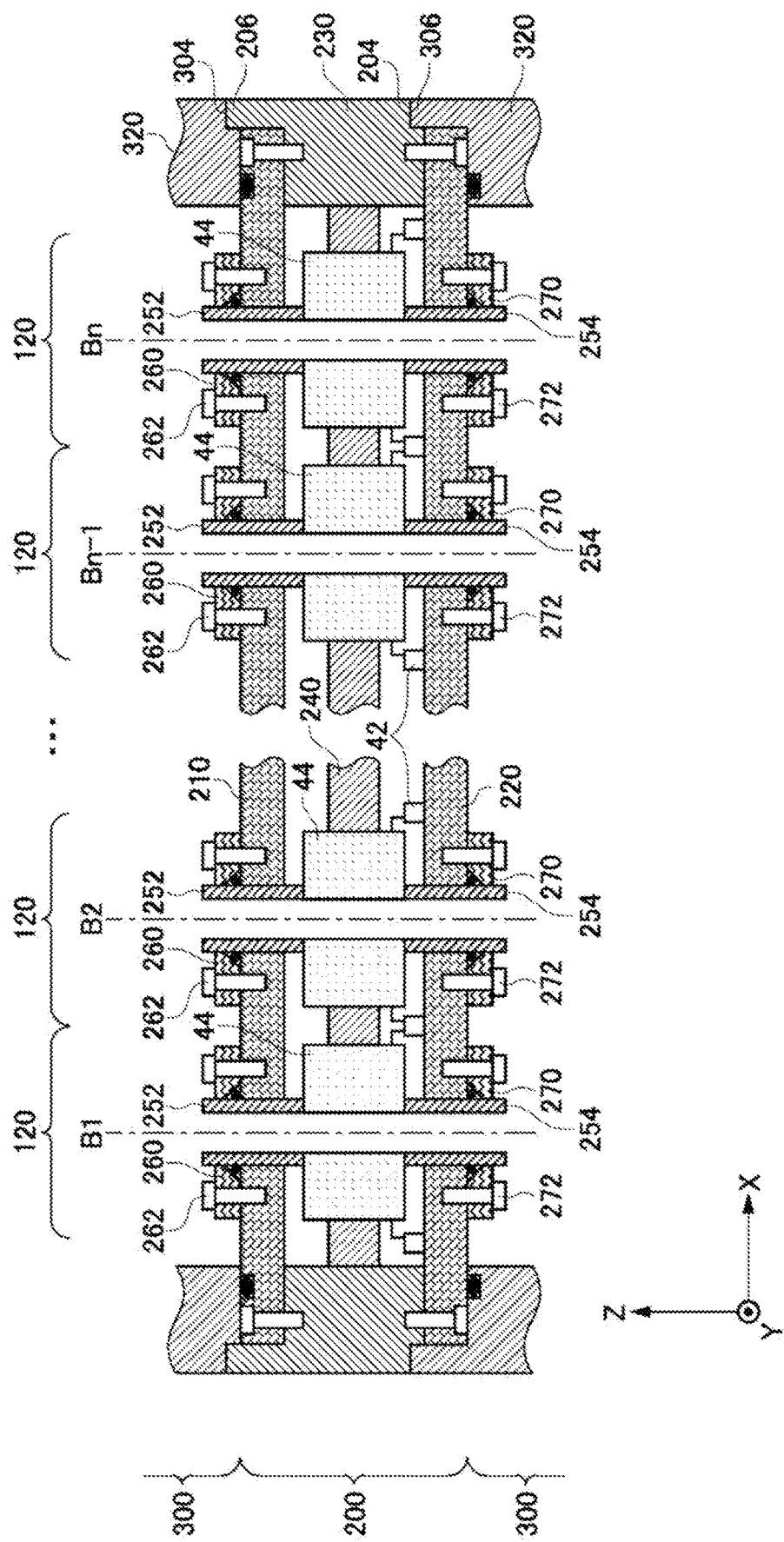
FIG. 7 illustrates a third exemplary configuration of the first unit 200 and second units 300 according to the present embodiment.

FIG. 7 illustrates a third exemplary configuration of the first unit 200 and second units 300 according to the present embodiment. Elements of the first unit 200 and second units 300 in the third exemplary configuration that operate in approximately the same manners as operations of the first unit 200 and second units 300 in the first exemplary configuration illustrated in FIG. 4 are given the same symbols, and explanations thereof are omitted. Similar to FIG. 4, FIG. 7 illustrates an exemplary cross-sectional view of the body tube 110 taken along a plane approximately parallel to the Z-X-plane. The first unit 200 in the third exemplary configuration includes electromagnetic optical elements 40 having parts penetrating the first partition wall 210 and second partition wall 220. Each of the electromagnetic optical elements 40 has a main body portion 44, a first extending portion 252, and a second extending portion 254.

The main body portion 44 is fixed to the supporting unit 240. The main body portion 44 is fixed to the supporting unit 240 so as to shield a magnetic-field-generating member such as a coil and a magnetic substance against a vacuum space. The main body portion 44 may have a housing case that houses the coil, magnetic substance or the like. The main body portion 44 has a through-hole to serve as a vacuum space that allows the passage therethrough of an electron beam.

The first extending portion 252 extends from a side of the main body portion 44 closer to the first partition wall 210, and penetrates the first partition wall 210. The first extending portion 252 may have a cross-section taken perpendicular to the direction of extension that is smaller than the cross-section of the main body portion 44. The first extending portion 252 has a cylindrical shape. For example, the first extending portion 252 may have a shape which is approximately the same as parts of the cylindrical members 250 explained with reference to FIG. 4.

The second extending portion 254 extends from a side of the main body portion 44 closer to the second partition wall 220, and penetrates the second partition wall 220. The second extending portion 254 may have a cross-section taken perpendicular to the direction of extension that is smaller than the cross-section of the main body portion 44. The second extending portion 254 has a cylindrical shape. For example, the second extending portion 254 may have a shape which is approximately the same as parts of the cylindrical members 250 explained with reference to FIG. 4. That is, the through-hole, first extending portion 252, and second extending portion 254 of the main body portion 44 form a vacuum space that allows the passage therethrough of an electron beam like the cylindrical members 250 explained with reference to FIG. 4.

The first extending portion 252 and first partition wall 210, and the second extending portion 254 and second partition wall 220 are sealed together by vacuum seals. The vacuum seal that seals together the first extending portion 252 and first partition wall 210 may be similar to the vacuum seal explained with reference to FIG. 5. In addition, the vacuum seal that seals together the second extending portion 254 and second partition wall 220 may also be similar to the vacuum seal explained with reference to FIG. 5. That is, the vacuum seals may seal the first partition wall 210 and first extending portion 252, and the second partition wall 220 and second extending portion 254 such that the first partition wall 210 is deformable along the first extending portion 252, and the second partition wall 220 is deformable along the second extending portion 254, depending on a pressure difference.

In addition, in the first unit 200 in the third exemplary configuration also, either one of the first extending portion 252 and second extending portion 254 may be sealed to be deformable, and the other of them may be fixed to a corresponding partition wall or the like. In this manner, also the exposure device 100 that uses the first unit 200 and second units 300 in the third exemplary configuration can be provided as a multi-beam exposure device that allows reduction of variations of the optical systems for electron beams, and also allows prevention of vacuum leakage.

Figure 8:
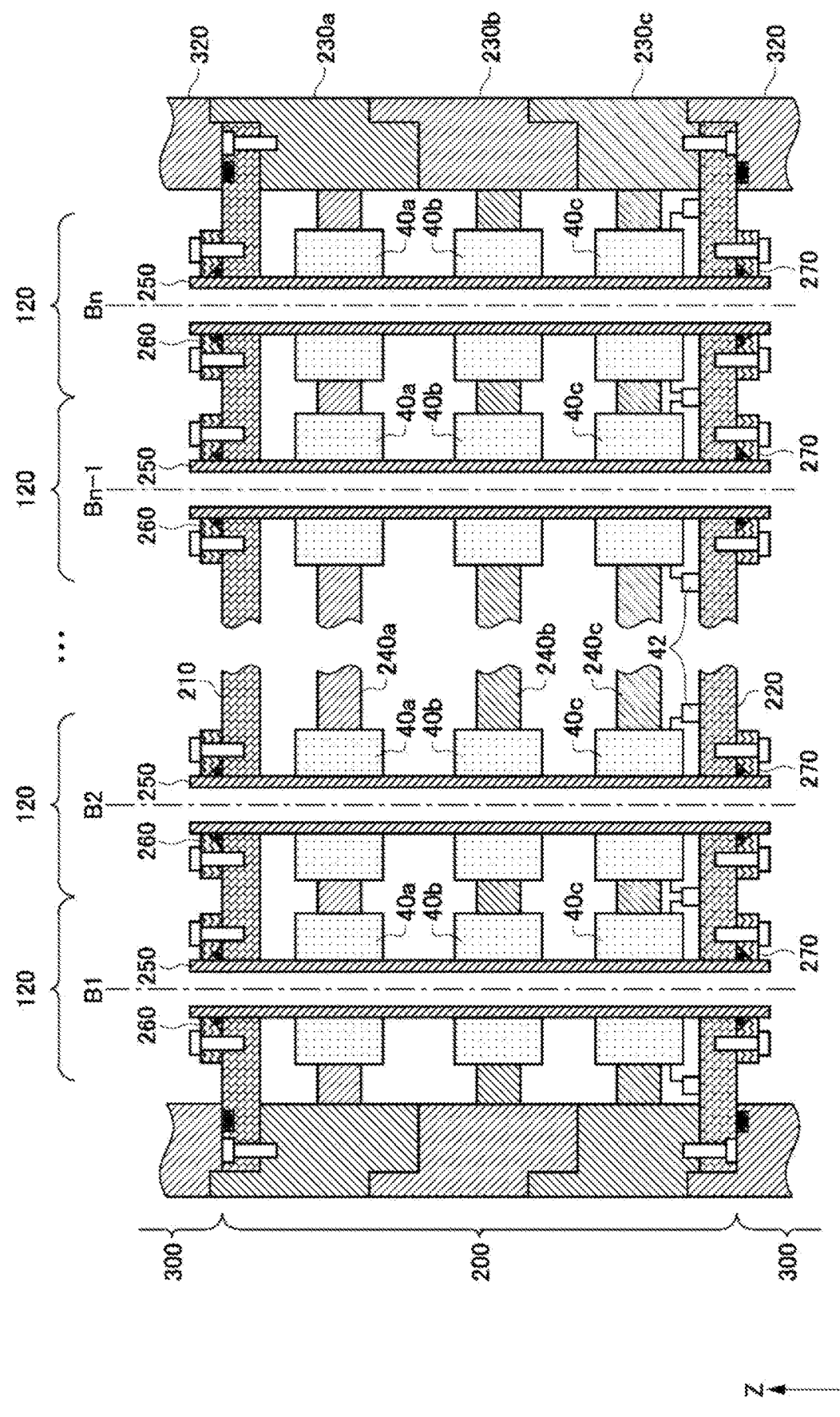
FIG. 8 illustrates a fourth exemplary configuration of the first unit 200 and second units 300 according to the present embodiment.

The first unit 200 in the first exemplary configuration to third exemplary configuration mentioned above illustrates an example in which one supporting unit 240 is provided, this is not the sole example. The first unit 200 may include a plurality of supporting units 240. FIG. 8 illustrates a fourth exemplary configuration of the first unit 200 and second units 300 according to the present embodiment. Elements of the first unit 200 and second units 300 in the fourth exemplary configuration that operate in approximately the same manners as operations of the first unit 200 and second units 300 in the first exemplary configuration illustrated in FIG. 4 are given the same symbols, and explanations thereof are omitted.

FIG. 8 illustrates an example in which the first unit 200 includes a supporting unit 240*a*, a supporting unit 240*b*, and a supporting unit 240*c*. Note that the three supporting units 240 may each keep electromagnetic optical elements 40 and cylindrical members 250 positioned in place. In this case, the three supporting units 240 may each be fixed to a corresponding frame 230.

For example, the supporting unit 240*c* is fixed to a frame 230*c*, and keeps electromagnetic optical elements 40*c* and cylindrical members 250 positioned in place. After such a frame 230*c* is assembled, and adjusted, a next frame 230*b* may be assembled, and adjusted. Note that the supporting unit 240*b* that keeps electromagnetic optical elements 40*b*, and cylindrical members 250 positioned in place is fixed to the frame 230*b*. Then, a frame 230*a* may be assembled, and adjusted above the frame 230*b*. Note that the supporting unit 240*a* that keeps electromagnetic optical elements 40*a*, and cylindrical members 250 positioned in place is fixed to the frame 230*a*.

If the first unit 200 includes a plurality of supporting units 240 in this manner, each one of them may be stacked for a corresponding frame 230 to form the first unit 200. Note that each of the frames 230 may have recessed portions, and protruding portions so as to facilitate the positioning at the time of stacking them.

Figure 9:
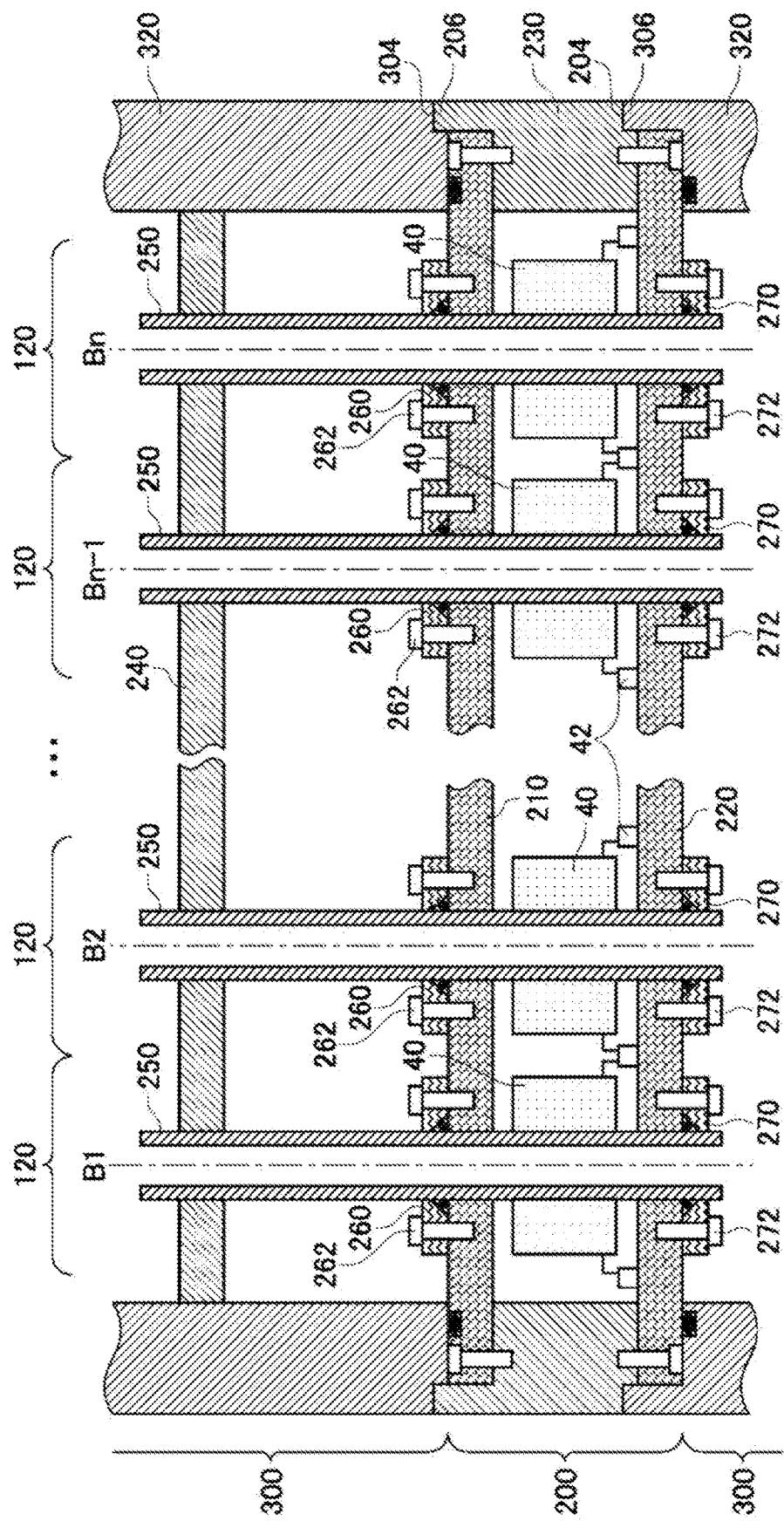
FIG. 9 illustrates a fifth exemplary configuration of the first unit 200 and second units 300 according to the present embodiment.

The first unit 200 and second units 300 in the first exemplary configuration to fourth exemplary configuration mentioned above illustrate an example in which the first unit 200 includes the supporting unit(s) 240, this is not the sole example. Instead of the first unit 200, a second unit 300 may include a supporting unit 240. FIG. 9 illustrates a fifth exemplary configuration of the first unit 200 and second units 300 according to the present embodiment. Elements of the first unit 200 and second units 300 in the fifth exemplary configuration that operate in approximately the same manners as operations of the first unit 200 and second units 300 in the first exemplary configuration illustrated in FIG. 4 are given the same symbols, and explanations thereof are omitted.

FIG. 9 illustrates an example in which, in the direction of extension of the body tube 110, a supporting unit 240 is provided opposite the second partition wall 220 while sandwiching the first partition wall 210. In this case, a plurality of cylindrical members 250 are provided corresponding to a plurality of charged particle beams, fixed to the supporting unit 240, and penetrate the supporting unit 240, first partition wall 210, and second partition wall 220. In addition, each of a plurality of electromagnetic optical elements 40 is fixed to one of the plurality of cylindrical members 250 in a non-vacuum space located between the first partition wall 210 and the second partition wall 220. That is, a second unit 300 provided with the supporting unit 240 may be stacked on the first unit 200.

In this manner, the electromagnetic optical elements 40 provided in the first unit 200 are positioned in place and fixed by the supporting unit 240 provided in the second unit 300. In this case also, each of the plurality of cylindrical members 250, and each of the first partition wall 210 and the second partition wall 220 are sealed together by a vacuum seal. In addition, the vacuum seal may seal the first partition wall 210 or second partition wall 220 such that the first partition wall 210 or second partition wall 220 can be deformed along the cylindrical member 250 depending on a pressure difference.

In this manner, since the supporting unit 240 in the fifth exemplary configuration is provided in a vacuum space of the second unit 300, it is barely deformed even if the second unit 300 is vacuum-exhausted through the exhausting opening 310. In addition, the first partition wall 210 and second partition wall 220 are deformed, barely changing the positions of the plurality of cylindrical members 250, even if the second unit 300 is vacuum-exhausted. Accordingly, the plurality of electromagnetic optical elements 40 are fixed to the supporting unit 240 via corresponding cylindrical members 250, and so are positioned in place stably without undergoing variations accompanying vacuum exhaustion.

Accordingly, the exposure device 100 according to the present embodiment can keep the state where the optical systems for a plurality of electron beams are positioned in place, and can prevent the precision of drawing of patterns on the sample 10 from lowering. Note that, although in the example explained with reference to FIG. 9, each of the plurality of cylindrical members 250 penetrates the first partition wall 210 and second partition wall 220, and is sealed together with and fixed to each of the first partition wall 210 and second partition wall 220, this is not the sole example. Each of the plurality of cylindrical members 250 may penetrate only the first partition wall 210, and sealed together only with and fixed only to the first partition wall 210. In addition, in this case, each of the plurality of cylindrical members 250 may also be fixed to the second partition wall 220. In addition, in this case, each of the plurality of cylindrical members 250 may not penetrate the second partition wall 220.

In addition, although in the example explained with reference to FIG. 9, the supporting unit 240 is provided opposite the second partition wall 220 while sandwiching the first partition wall 210 in the direction of extension of the body tube 110, this is not the sole example. The supporting unit 240 may be provided opposite the first partition wall 210 while sandwiching the second partition wall 220 in the direction of extension of body tube 110. In this case, the first unit 200 may be stacked on the second unit 300 provided with the supporting unit 240.

In this manner, the electromagnetic optical elements 40 provided in the first unit 200 may be positioned in place and fixed by a supporting unit 240 provided in either one of the second units 300 located above and below the first unit 200. In addition, instead of this, the electromagnetic optical elements 40 provided in the first unit 200 may be positioned in place and fixed by supporting units 240 provided in both second units 300 located above and below the first unit 200. That is, in the direction of extension of the body tube 110, the supporting units 240 may be provided opposite the second partition wall 220 while sandwiching the first partition wall 210, and opposite the first partition wall 210 while sandwiching the second partition wall 220.

In the example illustrated in FIG. 9, a second supporting unit that is provided opposite the supporting unit 240 while sandwiching the first partition wall 210 and second partition wall 220, and fixes each of the plurality of cylindrical members 250 may further be included. Each of the electromagnetic optical elements 40 may be held more stably by a plurality of supporting units 240.

Figure 10:
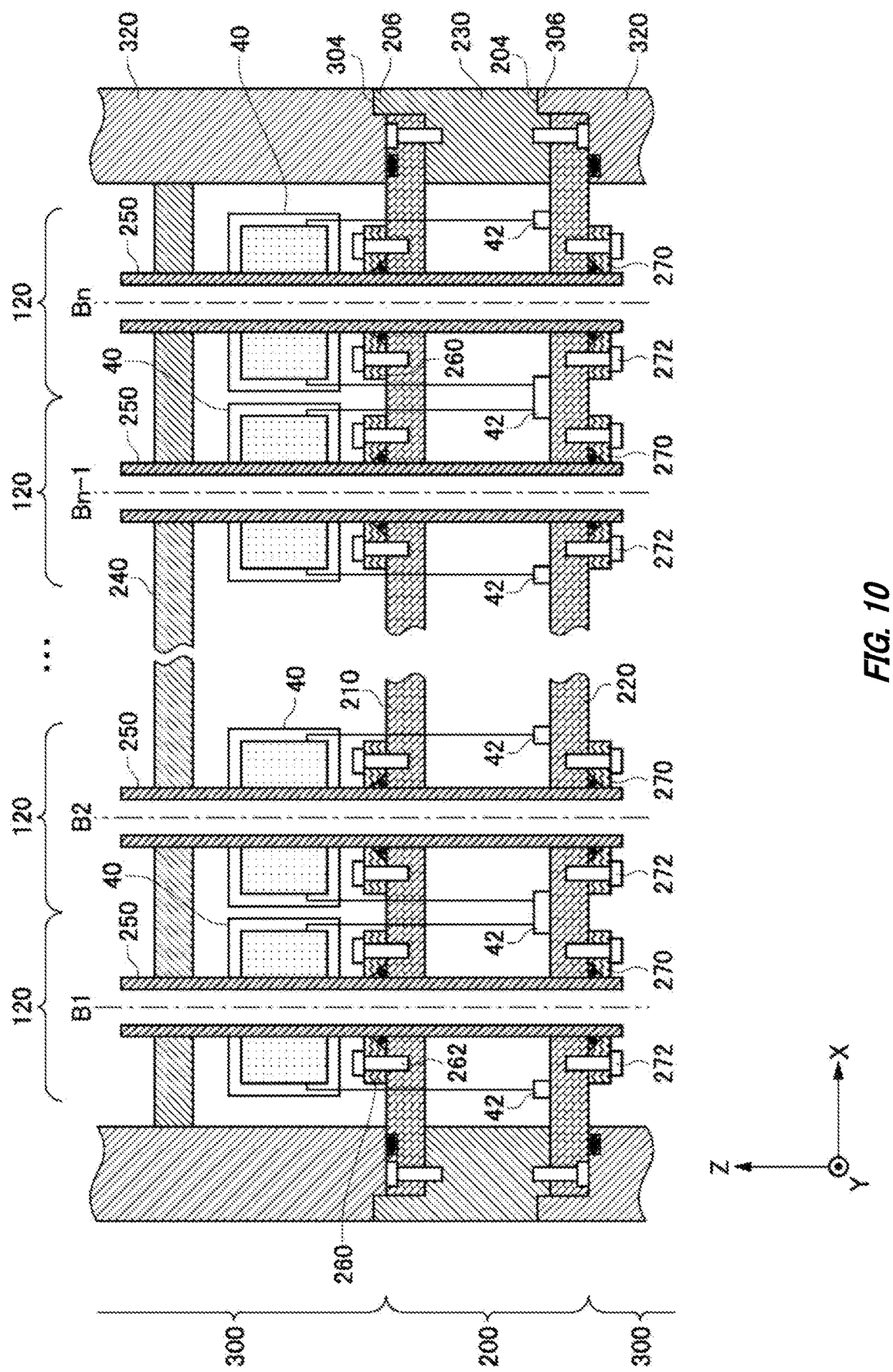
FIG. 10 illustrates a sixth exemplary configuration of the first unit 200 and second units 300 according to the present embodiment.

Although, in the examples of the first unit 200 and second units 300 in the first exemplary configuration to fifth exemplary configuration explained above, a plurality of electromagnetic optical elements 40 are provided in the first unit 200, this is not the sole example. At least some of the plurality of electromagnetic optical elements 40 may be provided in the second units 300 instead of the first unit 200. FIG. 10 illustrates a sixth exemplary configuration of the first unit 200 and second units 300 according to the present embodiment. Elements of the first unit 200 and second units 300 in the sixth exemplary configuration that operate in approximately the same manners as operations of the first unit 200 and second units 300 in the fifth exemplary configuration illustrated in FIG. 9 are given the same symbols, and explanations thereof are omitted.

FIG. 10 illustrates an example in which each of the plurality of electromagnetic optical elements 40 is provided in a vacuum space located between the supporting unit 240, and the first partition wall 210 and second partition wall 220. Each of the plurality of electromagnetic optical elements 40 may be housed in a housing case or the like so as not to be exposed to a vacuum space. That is, coils, magnetic substances or the like provided to the plurality of electromagnetic optical elements 40 are held in airtight housing cases or the like. In addition, each of the plurality of electromagnetic optical elements 40 is electrically connected to a wire provided in a non-vacuum space located between the first partition wall 210 and the second partition wall 220.

In this manner, by holding the electromagnetic optical elements 40 in airtight spaces, the electromagnetic optical elements 40 can be arranged in vacuum spaces. Thereby, the flexibility of design inside the body tube 110 can be enhanced. Note that although in the example illustrated in FIG. 10, the supporting unit 240 is provided in the second unit 300 stacked on the first unit 200, this is not the sole example. In the direction of extension of the body tube 110, a supporting unit(s) 240 may be provided opposite the second partition wall 220 while sandwiching the first partition wall 210, and/or opposite the first partition wall 210 while sandwiching the second partition wall 220.

Although an example of the vacuum seal illustrated in FIG. 5 is explained about the first unit 200 and second units 300 according to the present embodiment mentioned above, this is not the sole example. For example, although in the example explained with reference to FIG. 5, the inclined surface 264 that contacts the O-ring 266 has the first flange 260, instead of this, the first partition wall 210 may have a corresponding inclined surface. Such a configuration is explained next.

Figure 11:
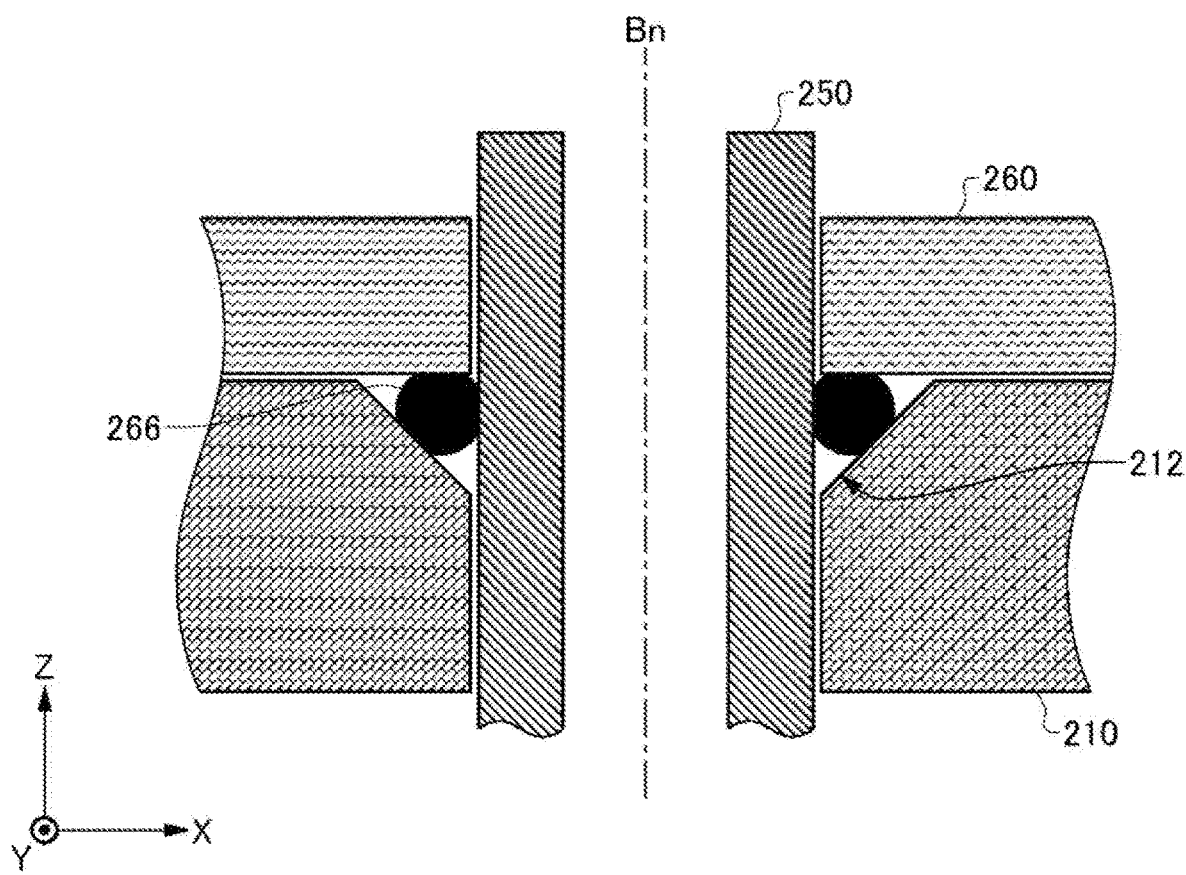
FIG. 11 illustrates a second exemplary configuration of the vacuum seal according to the present embodiment.

FIG. 11 illustrates a second exemplary configuration of the vacuum seal according to the present embodiment. Elements of the vacuum seal in the second exemplary configuration that operate in approximately the same manners as operations of the vacuum seal in the first exemplary configuration illustrated in FIG. 5 are given the same symbols, and explanations thereof are omitted. The first partition wall 210 in the second exemplary configuration has a surface 212 that contacts the O-ring 266. That is, if the first flange 260 is fixed to the first partition wall 210 by using a fixation screw 262, the surface 212 of the first partition wall 210, cylindrical member 250, and first flange 260 contact the O-ring 266 to form a vacuum seal. Thereby, a vacuum space and a non-vacuum space may be separated.

Figure 12:
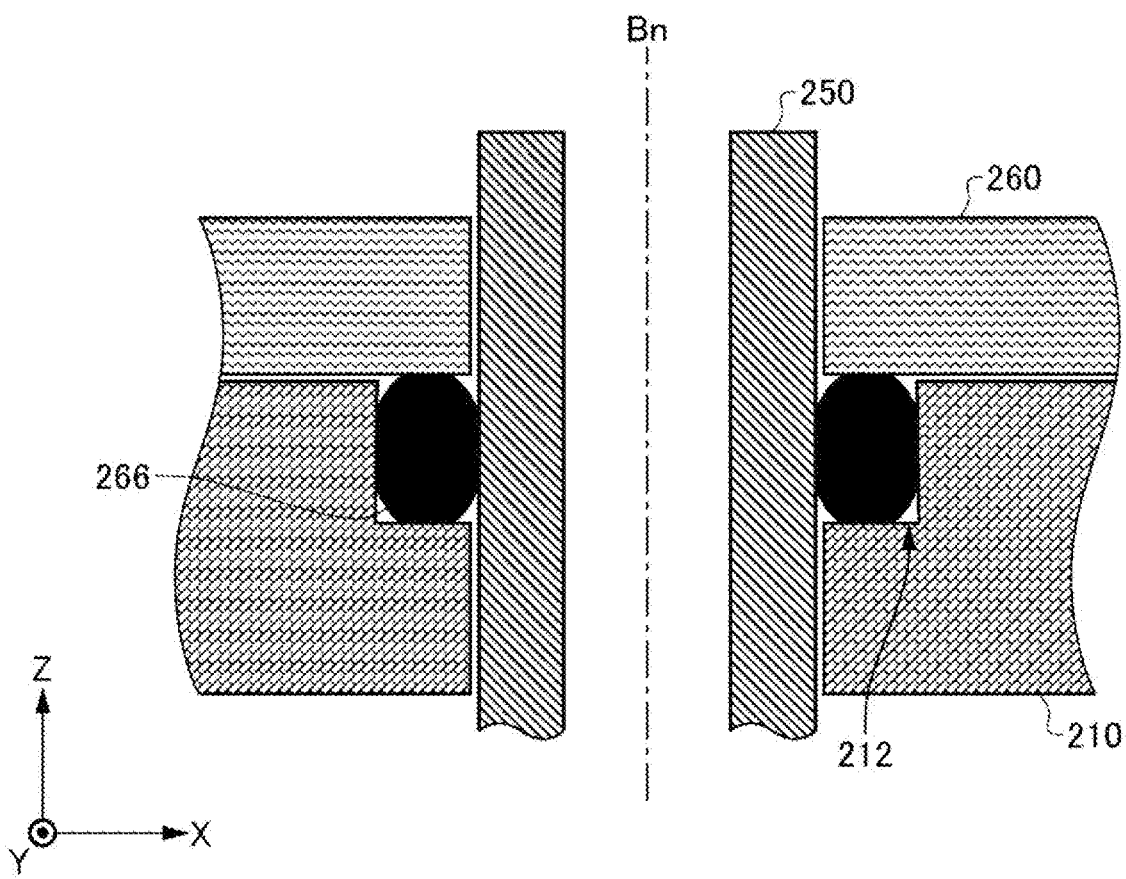
FIG. 12 illustrates a third exemplary configuration of the vacuum seal according to the present embodiment.

FIG. 12 illustrates a third exemplary configuration of the vacuum seal according to the present embodiment. Elements of the vacuum seal in the third exemplary configuration that operate in approximately the same manners as operations of the vacuum seal in the first exemplary configuration illustrated in FIG. 5 are given the same symbols, and explanations thereof are omitted. The first partition wall 210 in the second exemplary configuration has a plurality of surfaces 212 that contact the O-ring 266. In this case also, if the first flange 260 is fixed to the first partition wall 210 by using a fixation screw 262, the surface 212 of the first partition wall 210, cylindrical member 250, and first flange 260 contact the O-ring 266 to form a vacuum seal. Thereby, a vacuum space and a non-vacuum space may be separated.

In the example explained, the O-ring 266 is attached to the cylindrical member 250 according to the present embodiment. Such an O-ring 266 is formed to have a diameter which is approximately the same size as the outer circumference of the cylindrical member 250. Since part of the O-ring 266 is exposed to a vacuum area, grease or the like cannot be applied to it. Accordingly, friction between the cylindrical member 250 and the O-ring 266 increases, preventing the O-ring 266 from moving easily in the direction of extension of the cylindrical member 250, and it is sometimes difficult to perform accurate positioning. In this case, an end of the cylindrical member 250 may be machined (e.g., tapered) to enhance attachment of the O-ring 266. Such a configuration is explained next.

Figure 13:
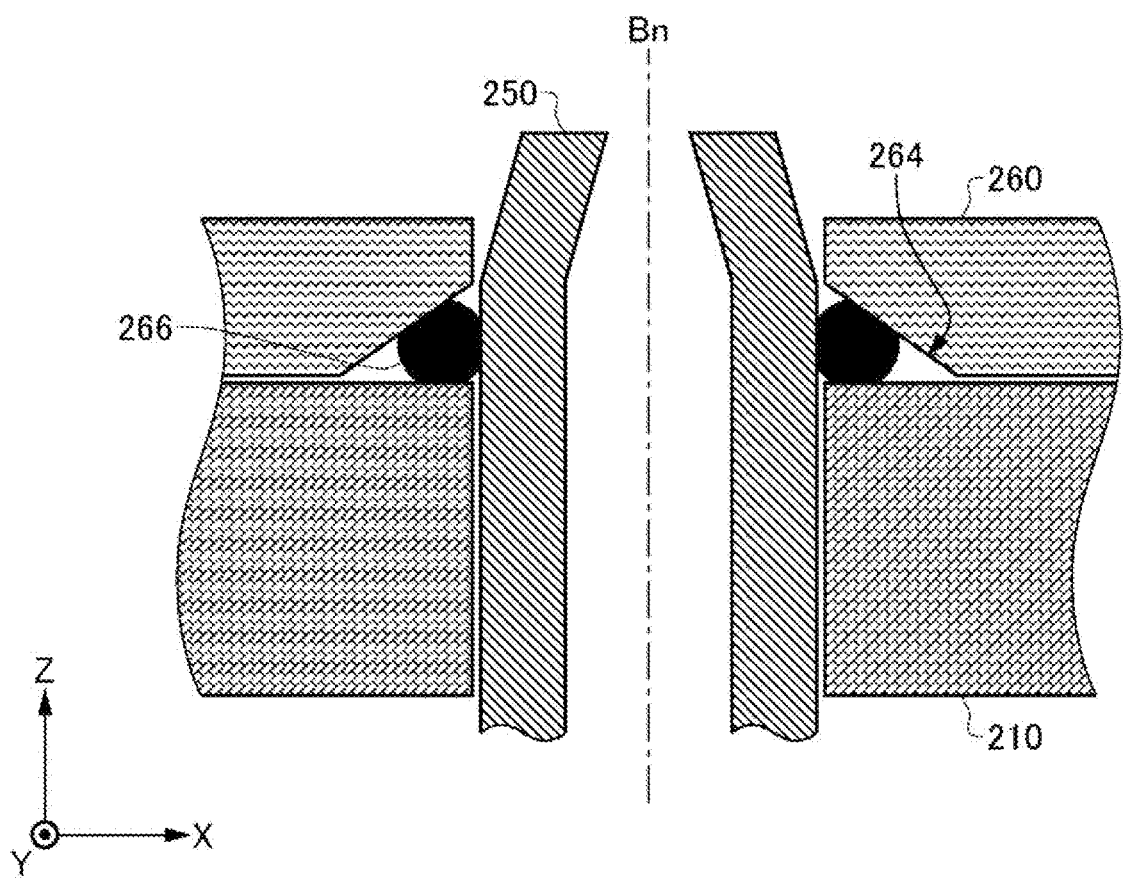
FIG. 13 illustrates a fourth exemplary configuration of the vacuum seal according to the present embodiment.

FIG. 13 illustrates a fourth exemplary configuration of the vacuum seal according to the present embodiment. Elements of the vacuum seal in the fourth exemplary configuration that operate in approximately the same manners as operations of the vacuum seal in the first exemplary configuration illustrated in FIG. 5 are given the same symbols, and explanations thereof are omitted. The cylindrical member 250 in the fourth exemplary configuration has an end portion machined into a tapered shape. That is, in an area that extends from an end portion of each of the plurality of cylindrical members 250 on a side closer to the first partition wall 210, and terminates at or before a location where a vacuum seal that seals together the cylindrical member 250 and the first partition wall 210 is to be provided, the cylindrical member 250 has a circumferential length that is shorter than circumferential lengths of the cylindrical member 250 between the first partition wall 210 and the second partition wall 220.

Thereby, the O-ring 266 can be attached to the cylindrical member 250 easily. In addition, the position of the O-ring 266 along the cylindrical member 250 can also be an optimum position which is at a location where the tapered shape terminates, and the cylindrical member 250 has the largest circumferential length, for example. Thereby, an operator or the like can adjust the position of the O-ring 266 while visually checking the position, and the efficiency of the work can be improved.

Such a tapered shape may be formed not only on a side closer to the first partition wall 210, but also on a side closer to the second partition wall 220. That is, in an area that extends from an end portion of each of the plurality of cylindrical members 250 on a side closer to the second partition wall 220, and terminates at or before a location where a vacuum seal that seals together the cylindrical member 250 and the second partition wall 220 is to be provided, the cylindrical member 250 may have a circumferential length that is shorter than circumferential lengths of the cylindrical member 250 between the first partition wall 210 and the second partition wall 220. In addition, such a tapered shape may be formed either on a side closer to the first partition wall 210 or on a side closer to the second partition wall 220.

In the exposure device 100 of the present embodiment explained above, the first unit 200 and second units 300 are provided corresponding to the plurality of charged particle beam sources 20. Note that the first unit 200 and second units 300 may correspond to all of the plurality of charged particle beam sources 20, or may correspond to some of the plurality of charged particle beam sources 20. Other than the first unit 200 and second units 300, the body tube 110 may further be provided with other units corresponding to remaining charged particle beam sources 20 among the plurality of charged particle beam sources 20.

Various embodiments of the present invention may be described with reference to flowcharts and block diagrams whose blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media.

Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable storage media may include any tangible device that can store instructions for execution by a suitable device, such that the computer-readable storage medium having instructions stored therein comprises an article of manufacture including instructions which can be executed to create means for performing operations specified in the flowcharts or block diagrams.

Examples of computer-readable media may include an electronic storage medium, a magnetic storage medium, an optical storage medium, an electromagnetic storage medium, a semiconductor storage medium, etc. More specific examples of computer-readable storage media may include a floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY (registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An exposure device comprising:
    a body tube that is depressurized to produce a vacuum state therein;
    a plurality of charged particle beam sources that are provided in the body tube, and emit a plurality of charged particle beams in a direction of extension of the body tube;
    a plurality of electromagnetic optical elements, each of which is provided corresponding to one of the plurality of charged particle beams in the body tube, and controls the one of the plurality of charged particle beams;
    a first partition wall and a second partition wall that are arranged separately from each other in the direction of extension in the body tube, and form a non-vacuum space between at least parts of the first partition wall and the second partition wall; and
    a supporting unit that is provided in the body tube, and supports the plurality of electromagnetic optical elements for positioning of the plurality of electromagnetic optical elements.

2. The exposure device according to claim 1, further comprising a wire that is provided in the non-vacuum space located between the first partition wall and the second partition wall, and is electrically connected to at least some of the plurality of electromagnetic optical elements.

3. The exposure device according to claim 1, wherein, in the direction of extension, the supporting unit is arranged between the first partition wall and the second partition wall.

4. The exposure device according to claim 3, wherein, in the direction of extension, the plurality of electromagnetic optical elements are arranged between the first partition wall and the second partition wall.

5. The exposure device according to claim 4, wherein the plurality of electromagnetic optical elements are arranged in the non-vacuum space located between the first partition wall and the second partition wall.

6. The exposure device according to claim 4, comprising a plurality of cylindrical members that are provided corresponding to the plurality of charged particle beams, and penetrate the first partition wall, the supporting unit, and the second partition wall.

7. The exposure device according to claim 6, wherein each of the plurality of cylindrical members is fixed to the supporting unit.

8. The exposure device according to claim 6, wherein each of the plurality of cylindrical members, and each of the first partition wall and the second partition wall are sealed together by a vacuum seal.

9. The exposure device according to claim 6, wherein, in an area that extends from an end portion of each of the plurality of cylindrical members on a side closer to the first partition wall, and terminates at or before a location where a vacuum seal that seals together the cylindrical member and the first partition wall is to be provided, and/or in an area that extends from an end portion of the cylindrical member on a side closer to the second partition wall, and terminates at or before a location where a vacuum seal that seals together the cylindrical member and the second partition wall is to be provided, the cylindrical member has a circumferential length that is shorter than circumferential lengths of the cylindrical member between the first partition wall and the second partition wall.

10. The exposure device according to claim 6, wherein each of the plurality of electromagnetic optical elements is provided at an outer circumference of one of the plurality of cylindrical members.

11. The exposure device according to claim 4, wherein each of the plurality of electromagnetic optical elements has:
    a main body portion fixed to the supporting unit;
    a first extending portion that extends from a side of the main body portion closer to the first partition wall, penetrates the first partition wall, and has a cross-section taken perpendicular to the direction of extension that is smaller than a cross-section of the main body portion; and
    a second extending portion that extends from a side of the main body portion closer to the second partition wall, penetrates the second partition wall, and has a cross-section taken perpendicular to the direction of extension that is smaller than a cross-section of the main body portion.

12. The exposure device according to claim 11, wherein the first extending portion, and the first partition wall are sealed together by a vacuum seal, and the second extending portion, and the second partition wall are sealed together by a vacuum seal.

13. The exposure device according to claim 1, wherein, in the direction of extension, the supporting unit is provided opposite the second partition wall while sandwiching the first partition wall, and/or is provided opposite the first partition wall while sandwiching the second partition wall.

14. The exposure device according to claim 13, comprising a plurality of cylindrical members that are provided corresponding to the plurality of charged particle beams, fixed to the supporting unit, and penetrate the supporting unit, the first partition wall, and the second partition wall.

15. The exposure device according to claim 14, wherein, in the non-vacuum space located between the first partition wall and the second partition wall, each of the plurality of electromagnetic optical elements is fixed to one of the plurality of cylindrical members.

16. The exposure device according to claim 14, wherein each of the plurality of cylindrical members, and each of the first partition wall and the second partition wall are sealed together by a vacuum seal.

17. The exposure device according to claim 16, wherein each of the plurality of electromagnetic optical elements:
    is provided in a vacuum space located between the supporting unit, and each of the first partition wall and the second partition wall; and
    is electrically connected to a wire provided in the non-vacuum space located between the first partition wall and the second partition wall.

18. The exposure device according to claim 14, further comprising a second supporting unit that is provided opposite the supporting unit while sandwiching the first partition wall and the second partition wall, and fixes each of the plurality of cylindrical members.

19. The exposure device according to claim 1, comprising a plurality of units each having a frame constituting part of the body tube, the plurality of units being stacked one on another in the direction of extension of the body tube, wherein a first unit in the plurality of units has the first partition wall, the second partition wall, and the supporting unit that are fixed inside the frame.

20. The exposure device according to claim 19, wherein a second unit adjacent to the first unit in the plurality of units does not have a blocking object between the plurality of charged particle beams that pass through the second unit.

* * * * *